United States Patent
Ni et al.

(10) Patent No.: US 9,935,588 B2
(45) Date of Patent: Apr. 3, 2018

(54) LINEARITY PERFORMANCE FOR MULTI-MODE POWER AMPLIFIERS

(71) Applicant: SKYWORKS SOLUTIONS, INC., Woburn, MA (US)

(72) Inventors: Jianxing Ni, San Jose, CA (US); Michael Lynn Gerard, Cedar Rapids, IA (US); Ramanan Bairavasubramanian, Hiawatha, IA (US); Dwayne Allen Rowland, Mayodan, NC (US); Matthew Lee Banowetz, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/296,007

(22) Filed: Oct. 17, 2016

(65) Prior Publication Data

US 2017/0133987 A1 May 11, 2017

Related U.S. Application Data

(63) Continuation of application No. 14/534,886, filed on Nov. 6, 2014, now Pat. No. 9,473,076.

(60) Provisional application No. 61/901,057, filed on Nov. 7, 2013, provisional application No. 62/004,141, filed on May 28, 2014.

(51) Int. Cl.
*H03F 3/24* (2006.01)
*H03F 3/19* (2006.01)
*H03F 3/21* (2006.01)
*H03F 1/32* (2006.01)
*H03F 3/195* (2006.01)

(52) U.S. Cl.
CPC ............... *H03F 1/32* (2013.01); *H03F 3/19* (2013.01); *H03F 3/245* (2013.01); *H03F 2200/18* (2013.01); *H03F 2200/451* (2013.01); *H03F 2201/3215* (2013.01)

(58) Field of Classification Search
USPC ................... 330/285, 296, 289, 310
See application file for complete search history.

(56) References Cited

U.S. PATENT DOCUMENTS

| 6,882,227 | B2 * | 4/2005 | Barry .................. H03F 1/0261 330/285 |
| 6,977,551 | B2 | 12/2005 | Ichitsubo et al. |
| 7,009,453 | B2 | 3/2006 | Kuriyama |

(Continued)

*Primary Examiner* — Hieu Nguyen
(74) *Attorney, Agent, or Firm* — Chang & Hale LLP

(57) ABSTRACT

Circuits, devices and methods related to multi-mode power amplifiers. A power amplifier (PA) assembly can include a radio-frequency (RF) amplification path having a first stage and a second stage, with each stage including a transistor. The PA assembly can further include a biasing circuit having a first bias path between a supply node and the base of a corresponding transistor. The PA assembly can further include a linearizing circuit implemented as either or both of a second bias path and a coupling path relative to the first bias path. The second bias path can be configured to provide an additional base bias current to the base under a selected condition. The coupling path can be configured to improve linearity of the corresponding transistor operating in a first mode while allowing a ballast resistance to be sufficiently robust for the corresponding transistor operating in a second mode.

20 Claims, 17 Drawing Sheets

(56) References Cited

U.S. PATENT DOCUMENTS

| | | | |
|---|---|---|---|
| 7,834,700 B2* | 11/2010 | Inamori | H03F 1/0261 |
| | | | 330/124 R |
| 2005/0264364 A1 | 12/2005 | Selin | |
| 2007/0024370 A1* | 2/2007 | Hirata | H03F 1/30 |
| | | | 330/285 |
| 2007/0096823 A1 | 5/2007 | Wang et al. | |
| 2012/0154054 A1 | 6/2012 | Kaczman et al. | |
| 2013/0116017 A1 | 5/2013 | Zhang et al. | |
| 2014/0306766 A1 | 10/2014 | Choi et al. | |

* cited by examiner

LINEARITY PERFORMANCE FOR MULTI-MODE POWER AMPLIFIERS

CROSS-REFERENCE TO RELATED APPLICATION(S)

This application is a continuation of U.S. application Ser. No. 14/534,886 filed Nov. 6, 2014, entitled IMPROVED LINEARITY PERFORMANCE FOR MULTI-MODE POWER AMPLIFIERS, which claims priority to U.S. Provisional Application No. 61/901,057 filed Nov. 7, 2013, entitled SYSTEMS, CIRCUITS AND METHODS RELATED TO MULTI-MODE POWER AMPLIFIERS HAVING IMPROVED LINEARITY, and U.S. Provisional Application No. 62/004,141 filed May 28, 2014, entitled CIRCUITS AND METHODS RELATED TO POWER AMPLIFIER BIAS CIRCUITS HAVING PARALLEL EMITTER FOLLOWERS, the benefits of the filing dates of which are hereby claimed and the disclosures of which are hereby expressly incorporated by reference herein in their entirety.

BACKGROUND

Field

The present disclosure generally relates to multi-mode power amplifiers having improved linearity.

Description of the Related Art

In wireless communication applications, size, cost, and performance are examples of factors that can be important for a given product. For example, to reduce both of the cost and product size, wireless components such as multi-mode and multi band power amplifiers are becoming more popular. In an example context of power amplifier (PA) products, some PA devices can be configured to provide dual mode functionalities such as GPRS (general packet radio service) and EDGE (enhanced data rates for GSM evolution) modes.

In many radio-frequency (RF) applications, a PA typically includes an amplifying transistor such as a heterojunction bipolar transistor (HBT). An input RF signal can be provided to the base of such a transistor, and the amplified RF signal can be output through the collector of the transistor. Supply voltage for the transistor can be provided to the collector, and a bias signal can be provided to the base. Such a bias signal is typically provided by a bias circuit.

SUMMARY

In accordance with some implementations, the present disclosure relates to a power-amplifier (PA) including a PA circuit that includes a bipolar junction transistor (BJT) having a base, a collector and an emitter. The BJT is configured to receive a radio-frequency (RF) signal through an input path and amplify the RF signal. The PA further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PA further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the ballast can include a DC ballasting resistance such as a DC ballasting resistor. In some embodiments, the BJT can include a heterojunction bipolar transistor (HBT) such as a gallium arsenide (GaAs) HBT.

In some embodiments, the BJT can be configured such that the RF signal is received at the base through the input path, and the amplified RF signal is output through the collector. The first mode can include an EDGE (enhanced data rates for GSM evolution) mode, and the second mode can include a GPRS (general packet radio service) mode. The biasing circuit can include a current mirror that generates the first bias signal for the operation of the PA circuit in the EDGE mode. The current mirror can include a BJT coupled to a reference current source, with the first bias signal being output through an emitter of the BJT to be provided to the common node. The ballast can be implemented between the common node and the base of the PA BJT, such that the common node functions as a base-emitter junction between the base of the PA BJT and the emitter of the current mirror BJT. The input path can include a DC blocking capacitance implemented between the base of the PA BJT and a node where the linearizing circuit is connected to. The linearizing circuit can be configured to couple the RF signal between the input path and the base-emitter junction to provide rectification on the base-emitter junction and correct AM-AM distortion and thereby yield the improved linearity.

In some embodiments, the biasing circuit can include a bias resistance implemented between a GPRS bias node and the common node, such that the second bias signal is provided to the gate of the BJT from the GPRS bias node through the bias resistance, the common node, and the ballast.

In some embodiments, the PA circuit can include a second BJT configured to provide another stage of amplification. In some embodiments, the second BJT can be implemented so that the input path of the BJT is coupled to an output of the second BJT. In some embodiments, the second BJT can be configured to receive the amplified RF signal from the BJT.

In some embodiments, the linearizing circuit can include a capacitance such as a capacitor. In some embodiments, the linearizing circuit can further include a resistance such as a resistor connected in series with the capacitance. In some embodiments, the linearizing circuit can further include an inductance such as an inductor connected in series with the capacitance.

In some implementations, the present disclosure relates to a power-amplifier (PA) module (PAM) that includes a packaging substrate configured to receive a plurality of components. The PAM further includes a power amplifier (PA) circuit formed on a die that is mounted on the packaging substrate. The PA circuit includes a bipolar junction transistor (BJT) having a base, a collector and an emitter. The BJT is configured to receive a radio-frequency (RF) signal through an input path and amplify the RF signal. The PAM further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PAM further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the biasing circuit can be formed on the die. In some embodiments, at least a portion of the linearizing circuit can be formed on the die.

According to some teachings, the present disclosure relates to a wireless device that includes a transceiver configured to process RF signals, an antenna in communication with the transceiver and configured to facilitate transmission of an amplified RF signal. The wireless device further includes a power amplifier (PA) module in communication with the transceiver and configured to generate the amplified RF signal. The PA module includes a power amplifier (PA) circuit that includes a bipolar junction transistor (BJT) having a base, a collector and an emitter. The BJT is configured to receive a radio-frequency (RF) signal through an input path and amplify the RF signal. The PA module further includes a biasing circuit in communication with the PA circuit. The biasing circuit is configured to provide a first bias signal or a second bias signal to the PA circuit for operation in a first mode or a second mode, respectively. Each of the first bias signal and the second bias signal is routed to the BJT through a path that includes a common node and a ballast. The PA module further includes a linearizing circuit implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some implementations, the present disclosure relates to a method for operating a power-amplifier (PA). The method includes receiving a radio-frequency (RF) signal through an input path in a PA circuit that includes a bipolar junction transistor (BJT) having a base, a collector and an emitter. The method further includes providing a first bias signal or a second bias signal to the PA circuit for operation in a first mode or a second mode, respectively. Each of the first bias signal and the second bias signal is routed to the BJT through a path that includes a common node and a ballast. The method further includes coupling the common node and a node along the input path with a linearizing circuit to improve linearity of the PA circuit operating in the first mode while allowing the ballast to be sufficiently robust for the PA circuit operating in the second mode.

According to some implementations, the present disclosure relates to a method for fabricating a power-amplifier (PA) die. The method includes providing a semiconductor substrate, and forming a power amplifier (PA) circuit on the semiconductor substrate. The PA circuit includes a bipolar junction transistor (BJT) having a base, a collector and an emitter, and the PA circuit is configured to receive a radio-frequency (RF) signal through an input path and amplify the RF signal. The method further includes forming a biasing circuit on the semiconductor die. The biasing circuit is configured to provide a first bias signal or a second bias signal to the PA circuit for operation in a first mode or a second mode, respectively. Each of the first bias signal and the second bias signal is routed to the PA circuit through a path that includes a common node and a ballast. The method further includes forming at least a portion of a linearizing circuit on the semiconductor substrate. The linearizing circuit is implemented between the common node and a node along the input path. The linearizing circuit is configured to provide a coupling path between the common node and the input path to improve linearity of the PA circuit operating in the first mode while allowing the ballast to be sufficiently robust for the PA circuit operating in the second mode.

In some embodiments, the semiconductor substrate can include gallium arsenide (GaAs). In some embodiments, the BJT can be a heterojunction bipolar transistor (HBT).

In some implementations, the present disclosure relates to a bias circuit for a power amplifier (PA). The bias circuit includes a first bias path implemented to couple a base node of an amplifying transistor and a supply node, with the first bias path being configured to provide a base bias current to the base node. The bias circuit further includes a second bias path implemented to be electrically parallel with the first bias path between the base node and the supply node. The second bias path is configured to provide an additional base bias current to the base node under a selected condition.

In some embodiments, the amplifying transistor can be part of a driver stage of the PA. In some embodiments, the second bias path can include an emitter follower having a collector, an emitter, and a base. The collector can be coupled to the supply node, and the emitter can be coupled to the base node. The base of the emitter follower can be coupled to a node having a DC voltage. The emitter follower can be configured so that its average emitter voltage increases with an increase in RF power at an RF input node. The emitter follower can be further configured to conduct at the condition to thereby provide the additional base bias current to the base node. The selected condition can include a selected level of increased RF power at the input node. The selected level of increased RF power resulting in the conduction through the emitter follower can result in a reversal of gain and phase droop associated with the driver stage. The DC voltage can be selected such that the reversal of gain and phase droop of the driver stage substantially coincides with a final stage compression. The DC voltage can be selected such that the emitter follower is biased just below a turn-on level with a selected low RF power at the input node.

In some embodiments, the second bias path can further include a resistance between the emitter of the emitter follower and the base node. In some embodiments, the bias circuit can further include a capacitance that couples the emitter of the emitter follower and the input node.

In some embodiments, the first bias path can include a field-effect transistor (FET) having a source, a drain, and a gate, with the source coupled to the supply node, and the drain coupled to the base node. The first bias path can further include a resistance between the drain of the FET and the base node. The first bias path can be part of a current mirror. The current mirror can include a reference side coupled to the first bias path. The reference side can include a bipolar-junction transistor (BJT) having a collector, an emitter, and a base, with the collector coupled to a reference current node, and the emitter coupled to a ground. The reference current node can be coupled to the gate of the FET of the first bias path, and the base of the BJT of the reference side can be coupled to a node between the source of the FET and the resistance of the first bias path. In some embodiments, each of the BJT of the reference side of the current mirror, the emitter follower of the second bias path, and the amplifying transistor can be a heterojunction bipolar transistor (HBT).

According to a number of implementations, the present disclosure relates to a method for biasing a power amplifier (PA). The method includes providing a base bias current to a base node of an amplifying transistor through a first bias path that couples the base node and a supply node. The method further includes generating an additional base bias current under a selected condition. The method further includes delivering the additional base bias current to the base node through a second bias path that is electrically parallel with the first bias path between the base node and the supply node.

In some teachings, the present disclosure relates to a power amplifier (PA) system that includes a PA circuit having an amplifying transistor. The amplifying transistor includes a base, a collector, and an emitter, with the base coupled to a base node for receiving a radio-frequency (RF) signal. The PA system further includes a bias circuit implemented to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition.

According to a number of implementations, the present disclosure relates to a power amplifier (PA) die that includes a semiconductor substrate and a PA circuit implemented on the semiconductor substrate. The PA circuit includes an amplifying transistor having a base, a collector, and an emitter. The base is coupled to a base node for receiving a radio-frequency (RF) signal. The PA circuit further includes a bias circuit implemented on the semiconductor substrate. The bias circuit is configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition.

In some implementations, the present disclosure relates to a power amplifier module that includes a packaging substrate configured to receive a plurality of components, and a power amplifier (PA) circuit formed on a die that is mounted on the packaging substrate. The PA circuit includes an amplifying transistor having a base, a collector, and an emitter, with the base coupled to a base node for receiving a radio-frequency (RF) signal. The module further includes a bias circuit coupled with the PA circuit and configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition. The module further includes a plurality of connectors configured to provide electrical connections between the PA circuit, the bias circuit, and the packaging substrate.

In a number of implementations, the present disclosure relates to a wireless device that includes a transceiver configured to generate a radio-frequency (RF) signal, and a power amplifier (PA) module in communication with the transceiver and configured to amplify the RF signal. The PA module includes a PA circuit having an amplifying transistor. The amplifying transistor includes a base, a collector, and an emitter, with the base coupled to a base node for receiving a radio-frequency (RF) signal. The PA module further includes a bias circuit coupled with the PA circuit and configured to bias the base of the amplifying transistor. The bias circuit includes a first bias path configured to couple the base node and a supply node. The first bias path is further configured to provide a base bias current to the base node. The bias circuit further includes a second bias path configured to be electrically parallel with the first bias path between the base node and the supply node. The second bias path is further configured to provide an additional base bias current to the base node under a selected condition. The wireless device further includes an antenna in communication with the PA module. The antenna is configured to facilitate transmission of the amplified RF signal.

In some implementations, the present disclosure relates to a power amplifier (PA) assembly that includes an amplification path configured to receive and amplify a radio-frequency (RF) signal. The amplification path includes a first stage and a second stage, with each of the first and second stages including a transistor with a base, a collector and an emitter. The PA assembly further includes a biasing circuit having a first bias path between a supply node and the base of a corresponding transistor. The PA assembly further includes a linearizing component implemented as either or both of a second bias path and a coupling path implemented relative to the first bias path. The second bias path is electrically parallel with the first bias path between the supply node and the base and configured to provide an additional base bias current to the base under a selected condition. The coupling path is implemented between an input path to the base and a common node along the first bias path and configured to improve linearity of the corresponding transistor operating in a first mode while allowing a ballast resistance to be sufficiently robust for the corresponding transistor operating in a second mode.

In some embodiments, the first stage can include a driver stage, and the second stage can include an output stage. The second bias path can be implemented for the transistor of the driver stage, and the coupling path can be implemented for the transistor of the output stage.

In some embodiments, the second bias path can include an emitter follower having a collector, an emitter, and a base, with the collector being coupled to the supply node, and the emitter being coupled to the base of the driver stage transistor. The base of the emitter follower can be coupled to a node having a DC voltage. The emitter follower can be configured so that its average emitter voltage increases with an increase in RF power at an RF input node. The emitter follower can be further configured to conduct at the selected condition to thereby provide the additional base bias current to the base. The selected condition can include a selected level of increased RF power at the input node. The selected level of increased RF power resulting in the conduction through the emitter follower can result in a reversal of gain and phase droop associated with the driver stage. The DC voltage can be selected such that the emitter follower is biased just below a turn-on level with a selected low RF power at the input node.

In some embodiments, the coupling path can be configured to couple an RF signal between the input path and a base-emitter junction of the output stage transistor to provide rectification on the base-emitter junction and correct AM-AM distortion and thereby yield improved linearity. The first mode can include an EDGE (enhanced data rates for GSM evolution) mode, and the second mode can include a GPRS (general packet radio service) mode. The input path can include a DC blocking capacitance implemented between the base of the output stage transistor and a node along the input path where the coupling circuit is connected to.

In some embodiments, the coupling path can include a capacitance. In some embodiments, the coupling path can include a resistance connected in series with the capacitance. In some embodiments, the coupling path can include an inductance connected in series with the capacitance.

According to some implementations, the present disclosure relates to a power-amplifier (PA) module that includes a packaging substrate configured to receive a plurality of components, and a power amplifier (PA) circuit formed on a die that is mounted on the packaging substrate. The PA circuit includes an amplification path configured to receive and amplify a radio-frequency (RF) signal. The amplification path includes a first stage and a second stage, with each of the first and second stages including a transistor with a base, a collector and an emitter. The PA module further includes a biasing circuit coupled to the PA circuit. The biasing circuit includes a first bias path between a supply node and the base of a corresponding transistor. The PA module further includes a linearizing component implemented as either or both of a second bias path and a coupling path implemented relative to the first bias path. The second bias path is electrically parallel with the first bias path between the supply node and the base and configured to provide an additional base bias current to the base under a selected condition. The coupling path is implemented between an input path to the base and a common node along the first bias path and configured to improve linearity of the corresponding transistor operating in a first mode while allowing a ballast resistance to be sufficiently robust for the corresponding transistor operating in a second mode.

In accordance with some teachings, the present disclosure relates to a method for operating a power-amplifier (PA). The method includes receiving a radio-frequency (RF) signal through an amplification path that includes a first stage and a second stage, with each of the first and second stages including a transistor with a base, a collector and an emitter. The method further includes providing at least one bias signal from a supply node, through a first bias path, to the base of a corresponding transistor. The method further includes improving linearity of the PA by either or both of providing an additional base bias current to the base under a selected condition through a second bias path that is electrically parallel with the first bias path, and coupling an input path to the base and a common node along the first bias path to improve linearity of the corresponding transistor operating in a first mode while allowing a ballast resistance to be sufficiently robust for the corresponding transistor operating in a second mode.

In some embodiments, the first stage can include a driver stage, and the second stage can include an output stage. The providing of the additional base bias current can be performed for the driver stage. The coupling can be performed for the output stage.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Introduction

Figure 1:
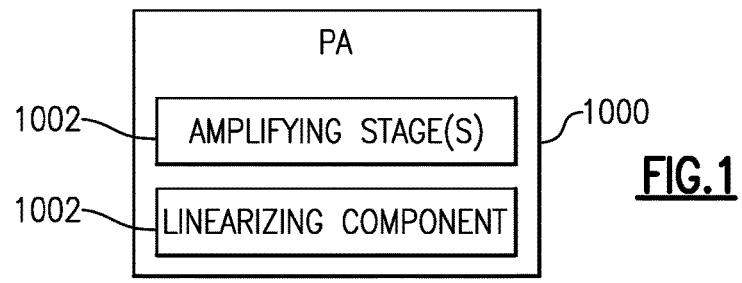
FIG. 1 shows that a power amplifier (PA) assembly can include one or more amplifying stages and one or more linearizing components for some or all of such amplifying stage(s).

FIG. 1 shows a power amplifier (PA) assembly 1000 having one or more amplifying stages 1002 and a linearizing component 1004. As described herein such a linearizing component can provide improved linearity performance for some or all of the amplifying stage(s) 1002.

Figure 2:
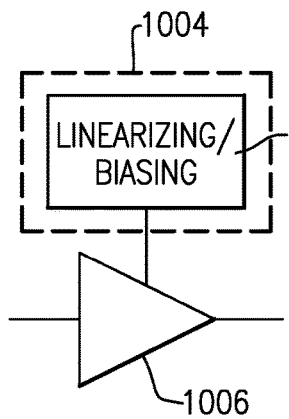
FIG. 2 shows that in some embodiments, the linearizing component of FIG. 1 can be implemented as a linearizing coupling circuit having one or more features as described herein.
Figure 3:
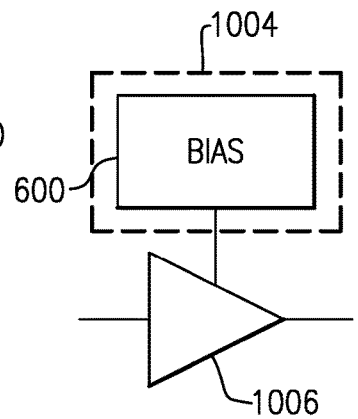
FIG. 3 shows that in some embodiments, the linearizing component of FIG. 1 can be implemented as a bias circuit having one or more features as described herein.
Figure 4:
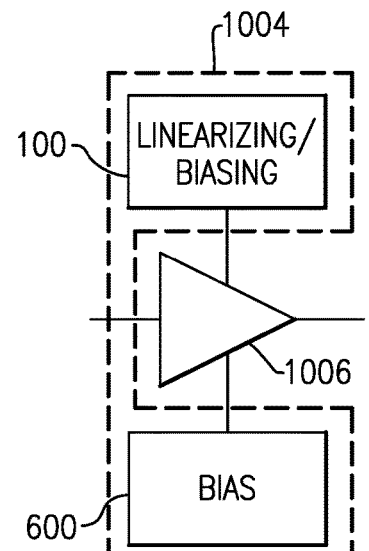
FIG. 4 shows that in some embodiments, the linearizing component of FIG. 1 can include both of the linearizing coupling circuit of FIG. 2 and the bias circuit of FIG. 3.

FIGS. 2-4 depict the one or more amplifying stages 1002 collectively as 1006. FIG. 2 shows that in some embodiments, the linearizing component 1004 of FIG. 1 can include a linearizing/biasing circuit 100 having one or more features described herein. Such a linearizing/biasing circuit can provide desirable linearizing functionality to some or all of the amplifying stages 1006. Various examples related to the linearizing/biasing circuit 100 of FIG. 2 are described herein in reference to FIGS. 6-16.

FIG. 3 shows that in some embodiments, the linearizing component 1004 of FIG. 1 can include a bias circuit 600 having one or more features described herein. Such a bias circuit can provide desirable linearizing functionality to some or all of the amplifying stages 1006. Various examples related to the bias circuit 600 of FIG. 3 are described herein in reference to FIGS. 17-23.

FIG. 4 shows that in some embodiments, the linearizing component 1004 of FIG. 1 can include a linearizing/biasing circuit 100 having one or more features described herein, and a bias circuit 600 having one or more features described herein. Such linearizing/biasing circuit and bias circuit can provide desirable linearizing functionality to some or all of the amplifying stages 1006. In some embodiments, the linearizing component 1004 can include a combination of some or all of the linearizing/biasing circuit 100 of FIG. 2 and some or all of the bias circuit 600 of FIG. 3.

Figure 5:
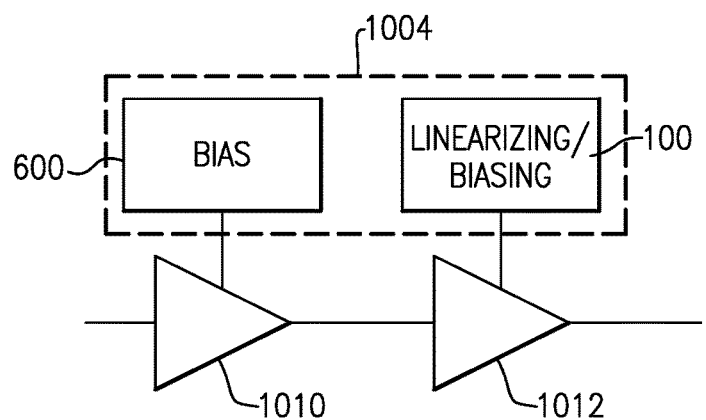
FIG. 5 shows that in some embodiments, the bias circuit of FIG. 4 can be implemented with a driver stage, and the linearizing coupling circuit of FIG. 4 can be implemented with an output stage.

FIG. 5 shows an example where the amplifying stages 1006 of FIG. 4 can include a driver stage 1010 and an output stage. It will be understood that the amplifying stages 1006 can include other numbers of stages. In the example of FIG. 5, the linearizing component 1004 is shown to include the bias circuit 600 coupled to the driver stage 1010, and the linearizing/biasing circuit 100 coupled to the output stage 1012. Examples related to each of such stages and their respective circuits coupled thereto are described herein. It will be understood that other combinations of the bias circuit 600, the linearizing/biasing circuit 100, and the two example stages 1010, 1012 can also be implemented.

Examples Related to Linearizing/Biasing Circuit:

In wireless communication applications, size, cost, and performance are examples of factors that can be important for a given product. For example, to reduce both of the cost and product size, wireless components such as multi-mode and multi band power amplifiers are becoming more popular. In an example context of power amplifier (PA) products, some PA devices can be configured to provide dual mode functionalities such as GPRS (general packet radio service) and EDGE (enhanced data rates for GSM evolution) modes. In some implementations, such dual-mode PA devices can be controlled by, for example, a finger-based integrated power amplifier control (FB-iPAC) control circuit. Examples related to such a control circuit can be found in U.S. Patent Application Publication No. US20140049321 titled SYSTEMS, CIRCUITS AND METHODS RELATED TO CONTROLLERS FOR RADIO-FREQUENCY POWER AMPLIFIERS which is expressly incorporated by reference in its entirety.

In some embodiments, such PA devices can be implemented on an HBT (heterojunction bipolar transistor) die, and can benefit from both lower cost and higher performance. To implement an EDGE biasing network into such a die, it can be desirable to have a DC ballasting resistance (e.g., a resistor) of each HBT finger be shared between the EDGE and GPRS sections of the biasing network. However, such a design can create a challenge.

For example, a portion of the HBT PA die corresponding to the GPRS section typically needs to be robust under extreme conditions, since the PA is driven to higher power in the GPRS mode. Hence, a higher-valued DC ballasting resistor is typically provided for each HBT finger to reduce the thermal positive feedback which can be caused by Vbe and/or operating temperature of the HBT.

On the other hand, for the EDGE mode, AM-AM distortion can be a significant cause of non-linearity. In some situations, a higher-valued DC ballasting resistor can yield such AM-AM distortion, thereby degrading the linearity performance and creating a design challenge. Described herein are various examples of how linearity of a PA (e.g., HBT PA) can be improved while maintaining the desired or required ruggedness. Although described in the context of GPRS and EDGE modes, it will be understood that one or more features of the present disclosure can also be implemented for other operating modes, as well as in other wireless applications. It will also be understood that although various examples are described herein in the context of HBTs, one or more features of the present disclosure can also be implemented for other types of bipolar junction transistors, and other types of amplifying transistors.

Figure 6:
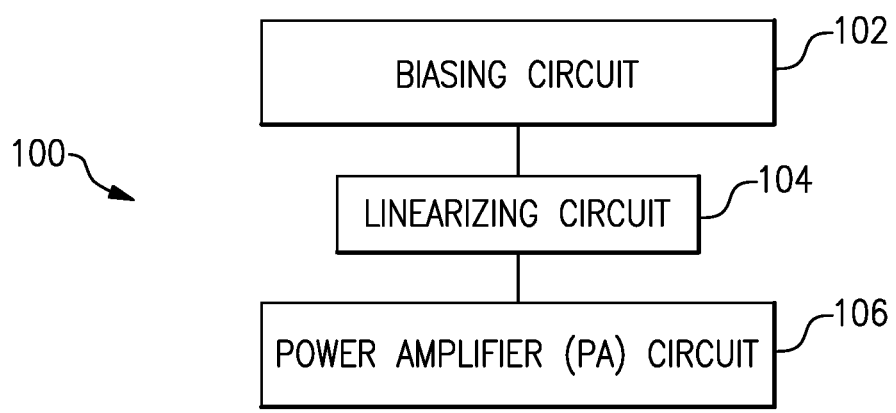
FIG. 6 depicts a power amplifier (PA) being biased with a biasing circuit via a linearizing circuit.

FIG. 6 shows a PA biasing configuration 100 where a PA circuit 106 is being biased by a biasing circuit 102 via or with a linearizing circuit 104. As described herein, the PA biasing configuration 100 can include one or more features that can address some or all of the foregoing challenges.

Figure 7:
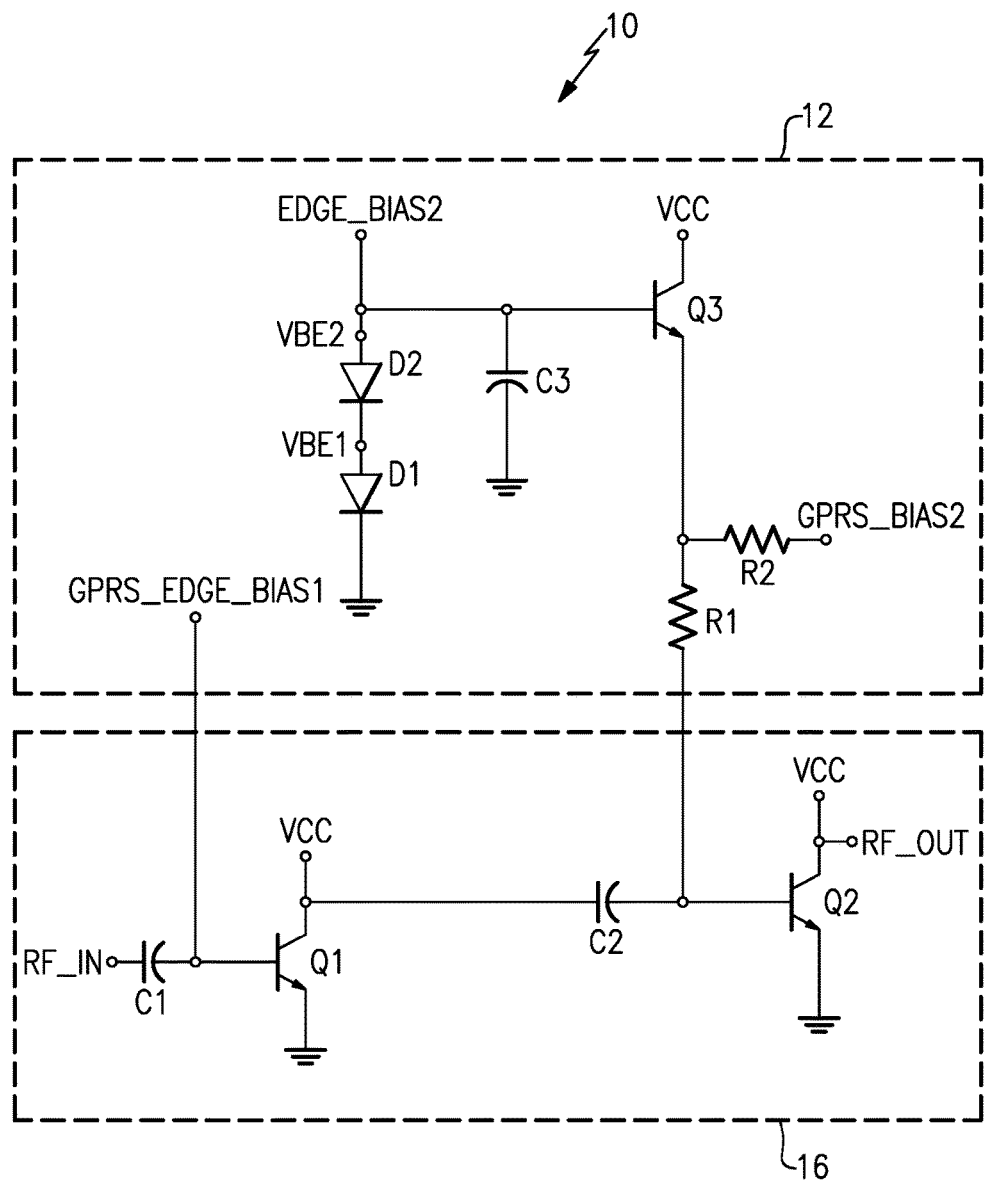
FIG. 7 shows an example PA being provided with bias signals from a biasing circuit.

FIG. 7 shows an example biasing configuration 10 in which a linearizing circuit as described herein can be implemented. The example biasing configuration 10 is shown to include an example PA circuit 16 in communication with an example biasing circuit 12. The example PA circuit 16 is depicted as having an input port RF_IN for receiving an RF signal to be amplified. Such an amplified RF signal can exit the PA circuit 16 through an output port RF_OUT.

In the example PA circuit 16, two stages of amplification are depicted. It will be understood, however, that the number of amplification stages can be more or less than two.

In the example of FIG. 7, the input RF signal received at the input port RF_IN can be provided to the base of the first HBT (Q1) through, for example, a DC blocking capacitance (e.g., capacitor) C1. The input path to the first HBT (Q1) may or may not include an input matching network (not shown).

The RF signal amplified by the first HBT (Q1) can be output through the HBT's collector, and such an output can be provided to the base of the second HBT (Q1) through, for example, a DC blocking capacitance (e.g., capacitor) C2. The path between the first and second HBTs (Q1, Q2) may or may not include an interstage matching network (not shown).

The RF signal amplified by the second HBT (Q2) can be output through the HBT's collector, and such an output can be provided to the output port RF_OUT of the PA circuit 16.

The output path from the second HBT (Q2) may or may not include an output matching network (not shown).

In the example of FIG. 7, supply voltage VCC for the first HBT (Q1) can be provided to its collector. Similarly, supply voltage VCC for the second HBT (Q2) can be provided to its collector.

In the example of FIG. 7, a bias signal for the first stage of the PA circuit 16 for both of the GPRS and EDGE modes can be provided to the base of the first HBT (Q1) from a bias node GPRS_EDGE_BIAS1 of the biasing circuit 12. For the second HBT (Q2), a GPRS bias signal can be provided to the base of Q2 from a bias node GPRS_BIAS2 of the biasing circuit 12 through a resistance R2 and a DC ballast resistance R1.

An EDGE bias signal for Q2 can be provided from a current mirror, where a reference current from a bias node EDGE_BIAS2 is mirrored in a supply path that includes a supply node VCC and an HBT (Q3). The mirrored current can be provided to the base of Q2 as a bias voltage by passing through the DC ballast resistance R1.

The example current mirror in the bias circuit 12 is depicted as including diodes D1 and D2 on the reference side. The example current mirror is also depicted as having the base of Q3 coupled to the bias node EDGE_BIAS2. A capacitance C3 is depicted as coupling the foregoing path between EDGE_BIAS2 and Q3 to the ground.

Figure 8:
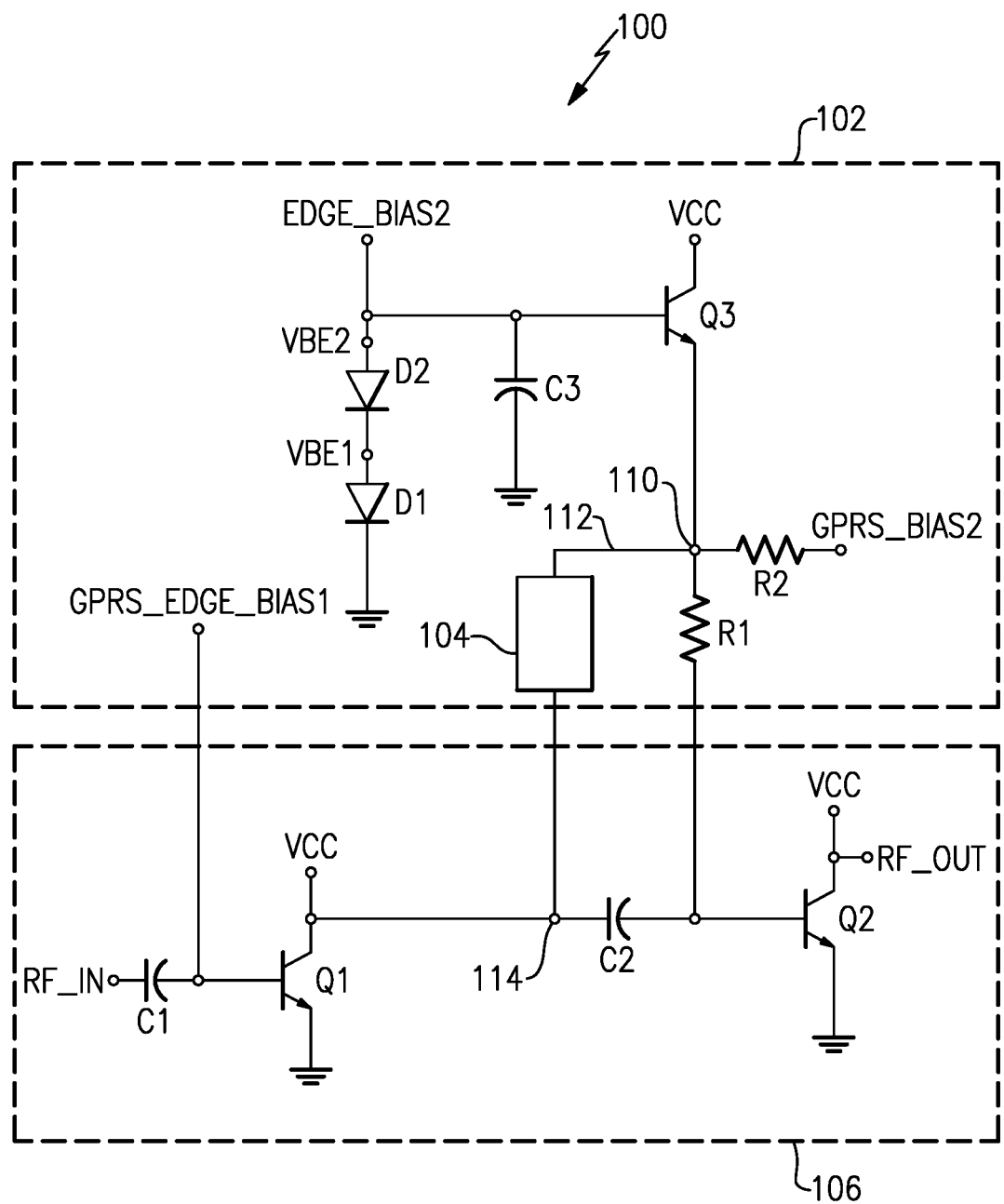
FIG. 8 shows an example where a linearizing circuit having one or more features as described herein can be implemented for the example biasing configuration of FIG. 7.

FIG. 8 shows that in some embodiments, a biasing configuration 100 can be implemented such that a linearizing circuit 104 along a path 112 couples a node 110 (between R1, R2 and the emitter of Q3) with a node 114 (on the input side of the DC block capacitance C2). Various non-limiting examples of the linearizing circuit 104 are described herein in greater detail. In FIG. 8, the current mirror, resistances R1 and R2, and the biasing of Q1 can be configured in a similar manner as the example of FIG. 7.

In the example of FIG. 8, the linearizing circuit 104 is depicted as being part of a biasing circuit 102. However, it will be understood that some or all of the linearizing circuit 104 can be part of the biasing circuit 102, be part of a PA circuit 106, be outside of both of the biasing circuit 102 and the PA circuit 106, or any combination thereof.

In the foregoing biasing configuration (100) of FIG. 8, the DC ballasting resistance R1 can be increased to any value needed or desired for ruggedness to accommodate, for example, the GPRS mode (e.g., GMSK modulation). Such a resistance can be configured to protect the RF array from effects such as thermal runaway. The DC ballasting resistance R1 can operate in conjunction with another resistance (e.g., resistance R2) as a biasing network for the GPRS mode.

In the foregoing biasing configuration (100) of FIG. 8, Q3 can be turned ON to accommodate, for example, the EDGE mode (e.g., GMSK modulation). In such a mode, the EDGE-mode biasing current can pass through the DC ballasting resistance R1 as well. As described herein, the path 112 with the linearizing circuit 104 can provide a coupling path for RF power entering (Q2) (e.g., from the preceding stage (Q1)) to the emitter of Q3. Such a coupling can yield rectification on the base-emitter junction of Q2 and Q3 to thereby correct AM-AM distortion, and hence improve linearity. At the same time, PA robustness can be achieved with the relatively large DC ballasting resistance R1.

Figure 9:
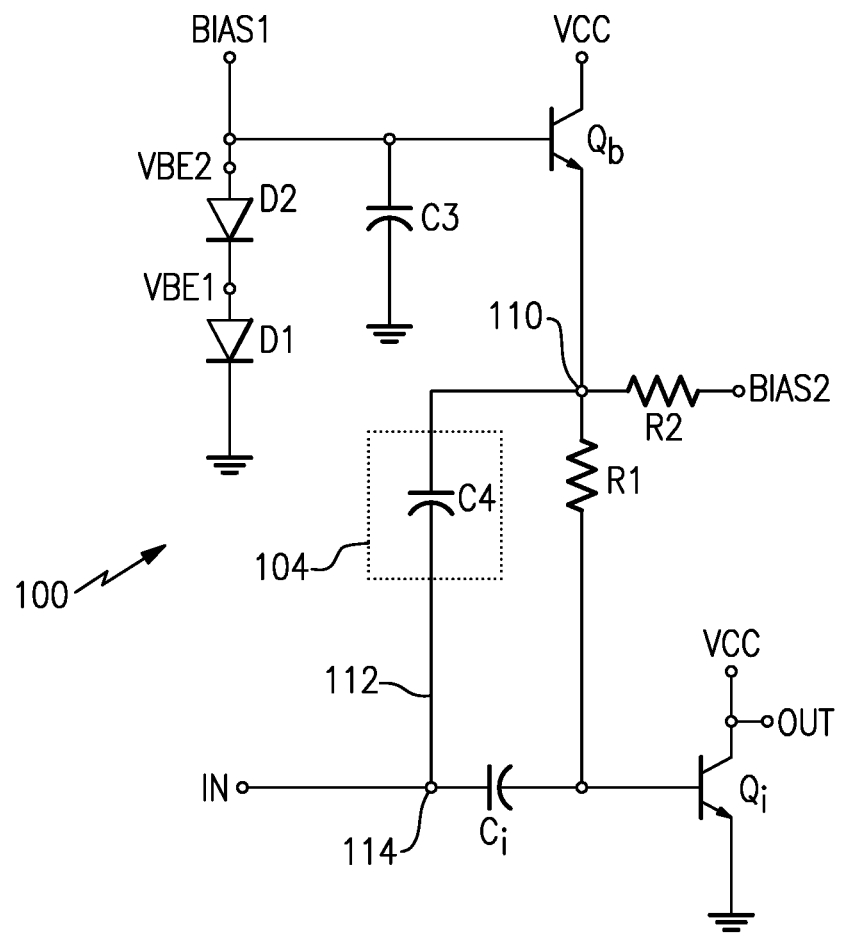
FIG. 9 shows an example of the linearizing circuit.

FIGS. 9-11 show various non-limiting examples of the linearizing circuit 104 described in reference to FIG. 8. As shown in FIGS. 9-11, the linearizing circuit 104 can be implemented on one or more stages of a PA circuit. In some embodiments, the linearizing circuit 104 can be implemented on a given stage of a PA circuit, and such a stage may or may not be preceded or be followed by another stage.

In an example biasing configuration 100 of FIG. 9, the linearizing circuit 104 can include a capacitance C4 (e.g., capacitor) along the path 112 that couples the nodes 110 and 114. Such a capacitance (C4) can provide the rectification functionality on the base-emitter junction of Q and Q3 as described in reference to FIG. 8 (Q2 and Q3) to thereby correct AM-AM distortion, and hence improve linearity.

Figure 10B:
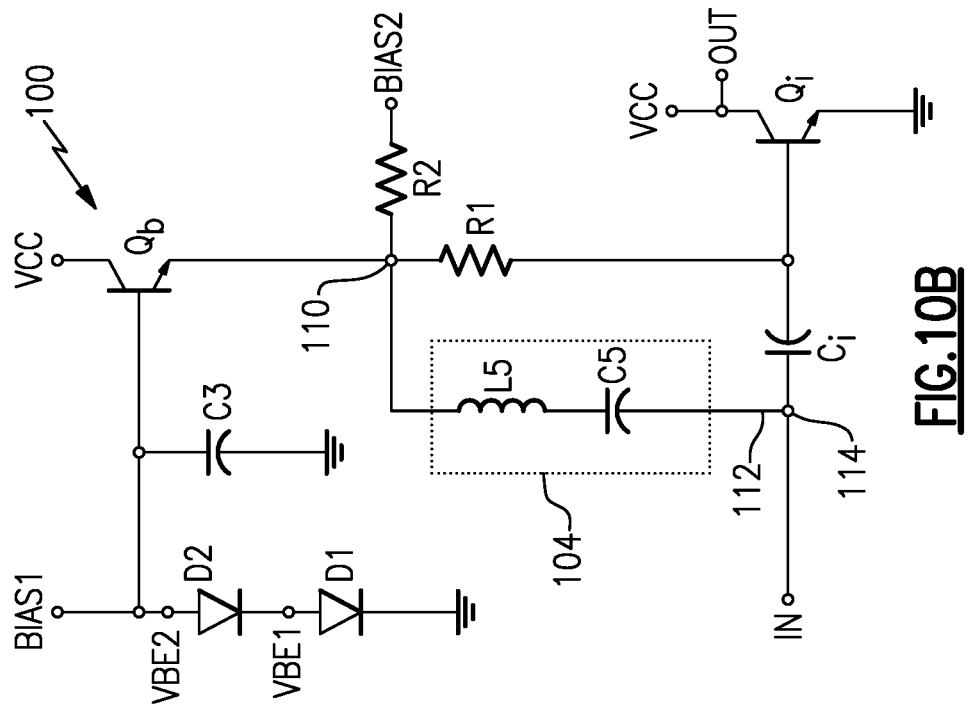
FIGS. 10A and 10B show more examples of the linearizing circuit.
Figure 10A:
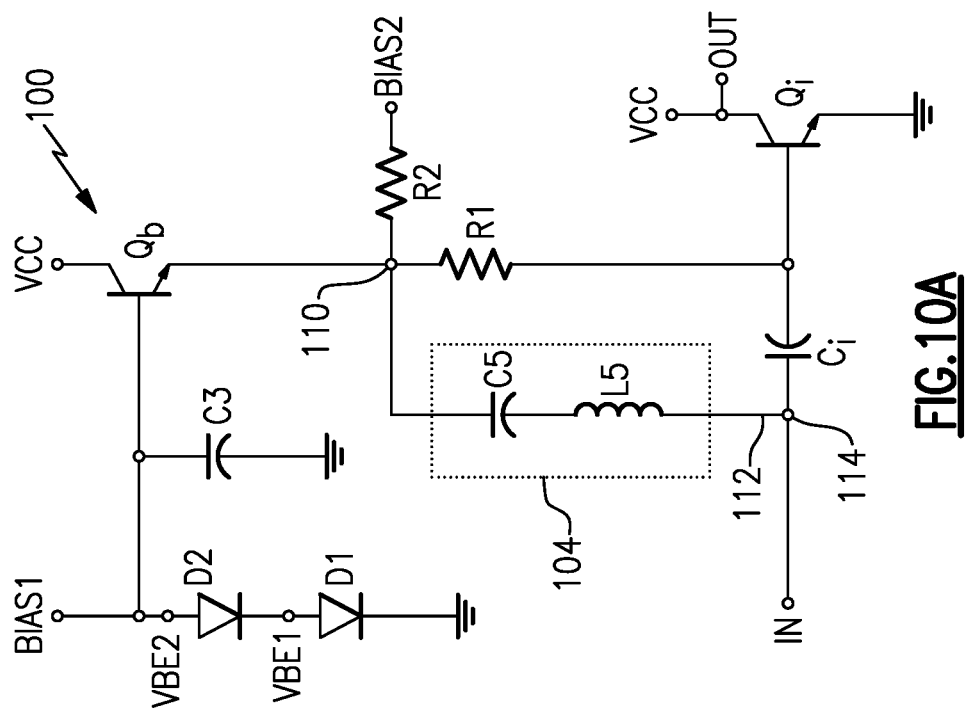

In example configurations 100 of FIGS. 10A and 10B, the linearizing circuit 104 can include a capacitance C5 (e.g., capacitor) connected in series with an inductance L5 along the path 112 that couples the nodes 110 and 114. In the example of FIG. 10A, the inductance L5 is between the capacitance C5 and the node 114. In the example of FIG. 10B, the order of L5 and C5 is reversed, so that the inductance L5 is between the capacitance C5 and the node 110.

Figure 11B:
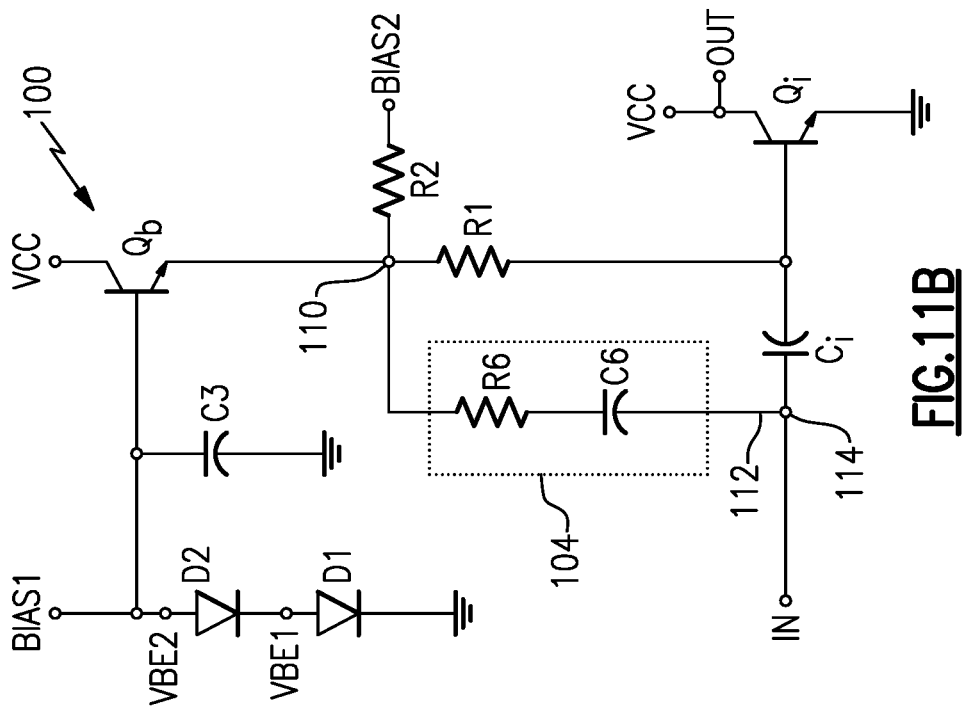
FIGS. 11A and 11B show yet more examples of the linearizing circuit.
Figure 11A:
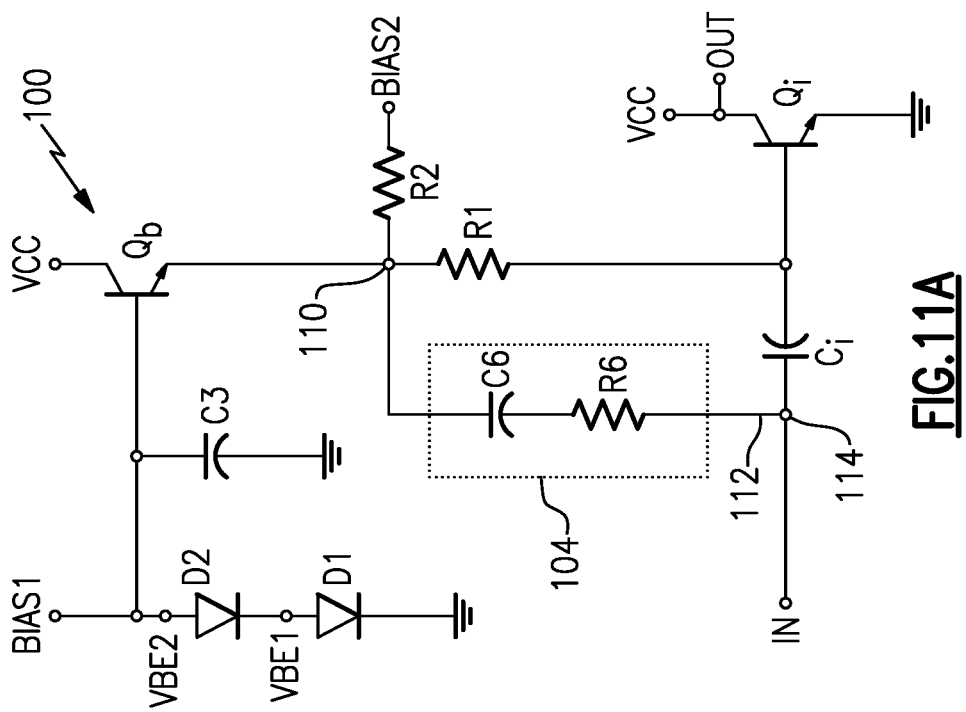

In example configurations 100 of FIGS. 11A and 11B, the linearizing circuit 104 can include a capacitance C6 (e.g., capacitor) connected in series with a resistance R6 (e.g., resistor) along the path 112 that couples the nodes 110 and 114. In the example of FIG. 11A, the resistance R6 is between the capacitance C6 and the node 114. In the example of FIG. 11B, the order of R6 and C6 is reversed, so that the resistance R6 is between the capacitance C6 and the node 110.

Figure 12:
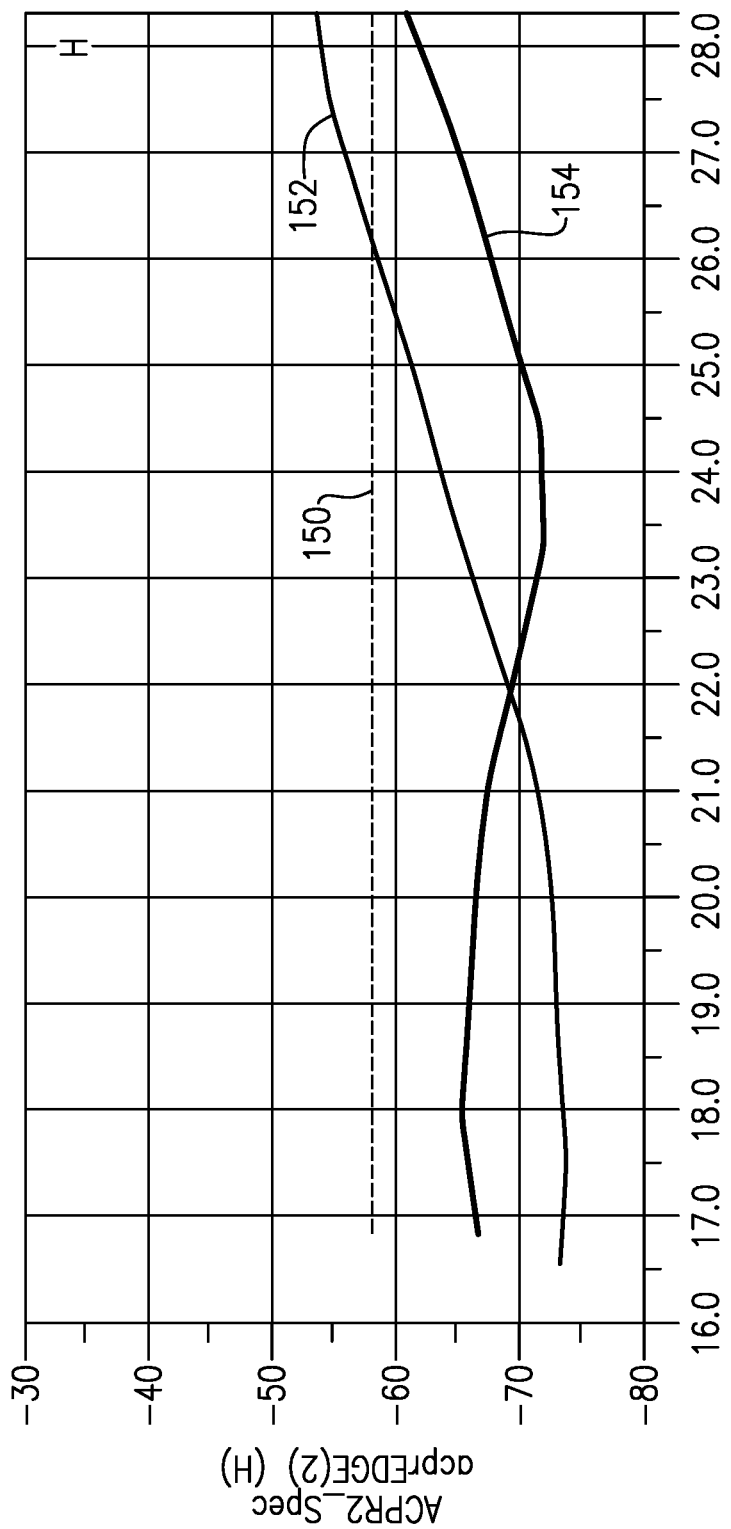
FIG. 12 shows an example of performance improvement that can be obtained by implementation of a linearizing circuit having one or more features as described herein.

FIG. 12 shows an example of improvement in linearity performance that can be obtained by use of a linearizing circuit as described herein. In FIG. 12, a horizontal dashed line 150 represents a specified value for an adjacent channel power ratio (ACPR) parameter in a range of power output gain of the PA 106 of FIG. 8. As is generally known, ACPR can represent linearity or non-linearity of a PA.

In FIG. 12, the curve indicated as 152 represents simulated ACPR as a function of output power of the PA 16 of FIG. 7 where linearizing circuit is not present. As one can see, the ACPR value exceeds the specified ACPR value 150 when the power output gain is greater than about 26.0 dBm. Hence, when the example PA's output gain is high, its non-linearity exceeds the specified value.

In FIG. 12, the curve indicated as 154 represents simulated ACPR as a function of output power of the PA 106 of FIG. 8 where linearizing circuit 104 is present. For the example curve 154, the linearizing circuit 104 includes a capacitance similar to C4 of FIG. 9. As one can see, the ACPR value remains well below the specified ACPR value 150 throughout the power output gain. For the example configuration of FIG. 8 that yields the ACPR curve 154 of FIG. 12, values of resistances and capacitances can be selected depending on particular designs.

Figure 13:
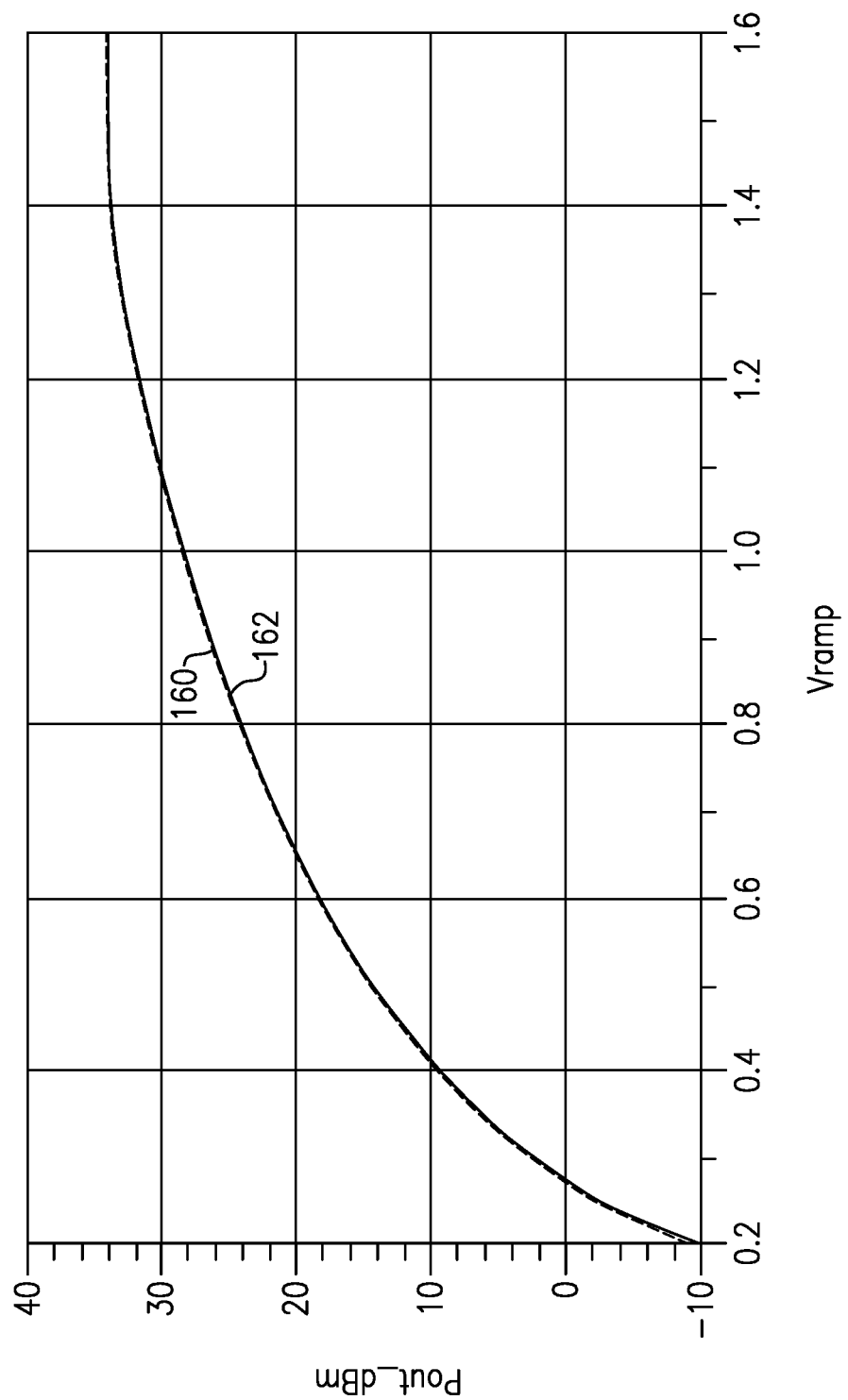
FIG. 13 shows an example where performance improvement such as the example of FIG. 12 can be obtained without significant degradation in performance of other parameters.

FIG. 13 shows by way of example that the foregoing improvement in linearity can be achieved without necessarily sacrificing performance of other operating parameters. In FIG. 13, power output gain is plotted as a function of power control voltage Vramp. Such a voltage can control, for example, the level of output power for GMSK modulation or optimize the performance of EDGE modulation. As shown in FIG. 13, the addition of the linearizing circuit (such as the example of FIG. 9) in FIG. 8 has little or no degrading effect on the Vramp dependence of the power output gain.

Figure 15:
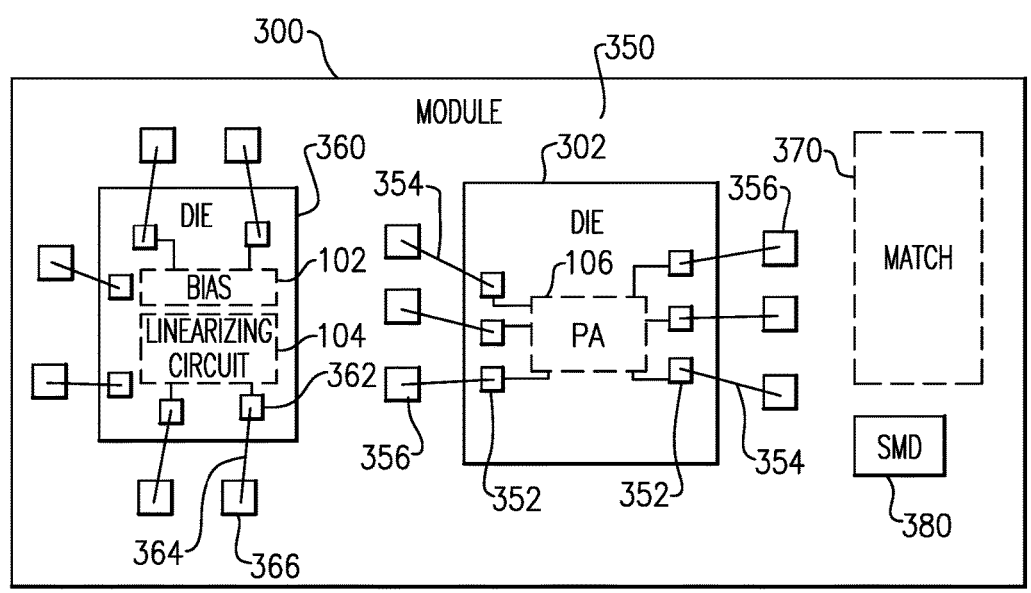
FIG. 15 shows that in some embodiments, a linearizing circuit having one or more features as described herein can be a part of a module.
Figure 16:
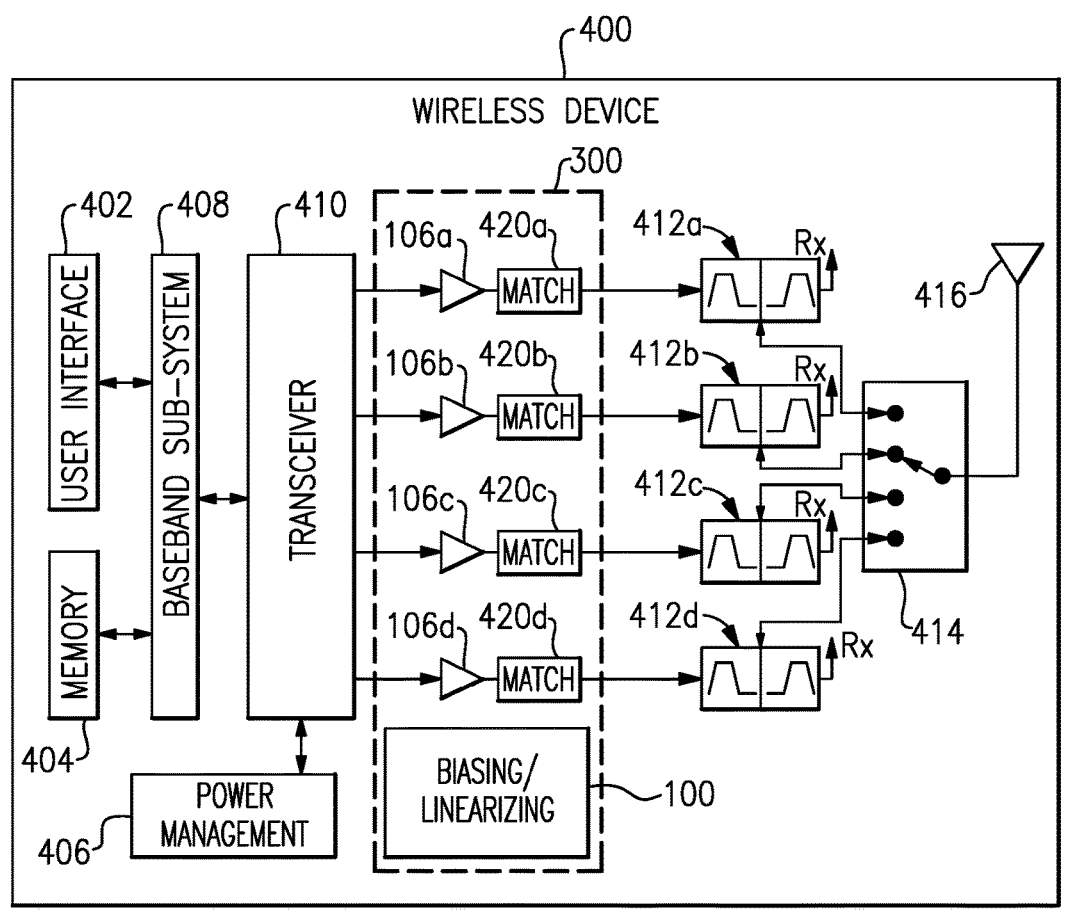
FIG. 16 shows that in some embodiments, a linearizing circuit having one or more features as described herein can be a part of a wireless device.

In some embodiments, a linearizing circuit having one or more features as described herein can be implemented in different products. FIGS. 14-16 show non-limiting examples of such products. FIGS. 14A-14E show various examples of how a linearizing circuit 104 can be implemented at a die level. FIG. 15 shows an example of how a linearizing circuit 104 can be implemented in a module such as a packaged module. FIG. 16 shows an example of how a linearizing circuit can be implemented in a wireless device.

Figure 14A:
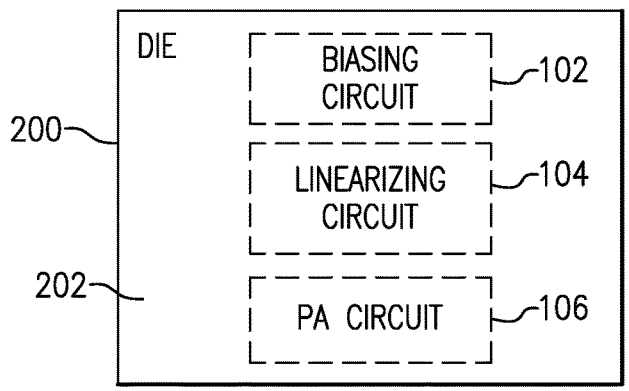
FIGS. 14A-14E show various non-limiting examples of how a linearizing circuit having one or more features as described herein can be implemented on or relative to one or more semiconductor die.

FIGS. 14A-14E show that a linearizing circuit 104 having one or more features as described herein can be implemented on one or more die. FIG. 14A shows that in some embodiments, a linearizing circuit 104 can be formed on a semiconductor substrate 202 of a die 200 that also includes a biasing circuit 102 and a PA circuit 106. Such a die can include, for example, an HBT die based on gallium arsenide (GaAs) substrate.

Figure 14B:
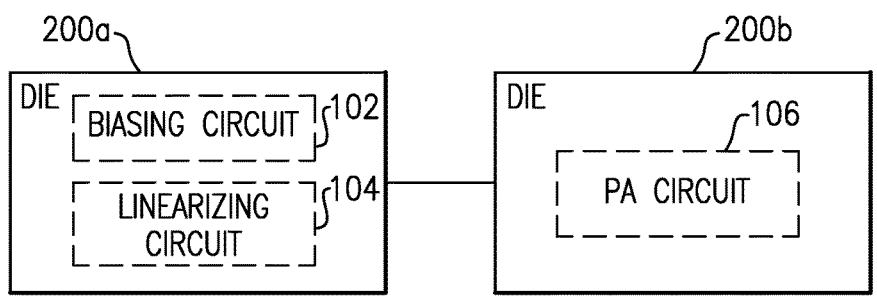
Figure 14C:
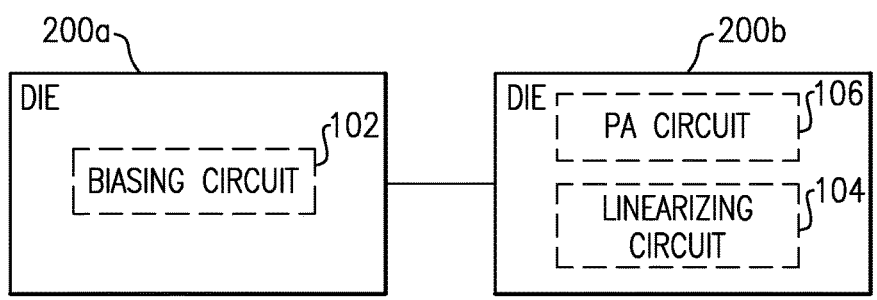
Figure 14D:
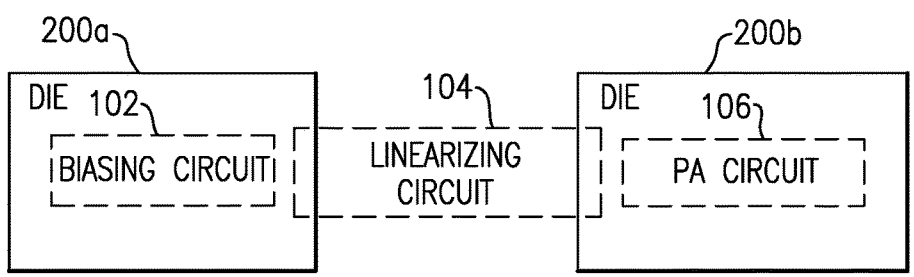
Figure 14E:
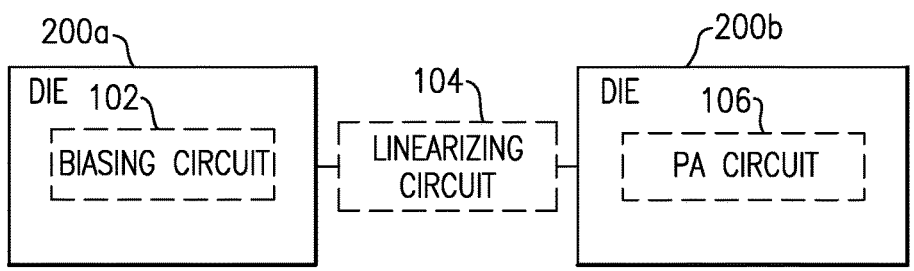

FIGS. 14B-14E show examples where a biasing circuit 102 can be implemented on a first die 200a, and a PA circuit 106 can be implemented on a second die 200b. FIG. 14B shows that in some embodiments, a linearizing circuit 104 having one or more features as described herein can be implemented on the first die 200a that includes the bias circuit 102. FIG. 14C shows that in some embodiments, a linearizing circuit 104 having one or more features as described herein can be implemented on the second die 200b that includes the PA circuit 106. FIG. 14D shows that in some embodiments, a linearizing circuit 104 having one or more features as described herein can be implemented partly on the first die 200a, partly on the second die 200b, and partly out of both die 200a, 200b. FIG. 14E shows that in some embodiments, a linearizing circuit 104 having one or more features as described herein can be implemented substantially out of both die 200a, 200b. Other configurations are also possible.

FIG. 15 schematically depicts an example module 300 that can be configured to include a linearizing circuit 104 having one or more features as described herein. In FIG. 15, the example module 300 is shown to include a PA die 302 that includes a PA circuit 106 (e.g., HBT PA circuit). In the example of FIG. 15, a biasing circuit 102 and a linearizing circuit 104 are depicted as being implemented on a separate die 360. However, it will be understood that the PA circuit 106, the biasing circuit 102, and the linearizing circuit 104 can be configured in other manners, such as the examples described in reference to FIGS. 14A-14E.

In the example module 300 of FIG. 15, the die 302 is shown to be mounted on a substrate 350. Such a die can be fabricated using a number of semiconductor process technologies, including the examples described herein. The die 302 can include a plurality of electrical contact pads 352 configured to allow formation of electrical connections 354 such as wirebonds between the die 302 and contact pads 356 formed on the packaging substrate 350.

In FIG. 15, the die 360 as described herein is shown to be mounted on the substrate 350. Such a die can be fabricated using a number of semiconductor process technologies, including the examples described herein. The die 360 can include a plurality of electrical contact pads 362 configured to allow formation of electrical connections 364 such as wirebonds between the die 360 and contact pads 366 formed on the packaging substrate 350.

The packaging substrate 350 can be configured to receive a plurality of components such as the die 302, 360 and one or more SMDs (e.g., 380). In some embodiments, the packaging substrate 350 can include a laminate substrate.

In the example packaged module 300, a matching circuit 370 can be implemented on and/or within the substrate 350. Such a matching circuit 370 can provide matching functionality for matching networks associated with the PA circuit 106.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 16 schematically depicts an example wireless device 400 having one or more advantageous features described herein. In the example, one or more PAs 106 are shown to be biased by a PA biasing system 100 having one or more features as described herein. Such PAs and biasing system can facilitate, for example, multi-band operation of the wireless device 400. In embodiments where the PAs, biasing system, and matching circuits 420 are packaged into a module, such a module can be represented by a dashed box 300.

The PAs 106 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the PAs 106 are shown to be matched (via match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 17:
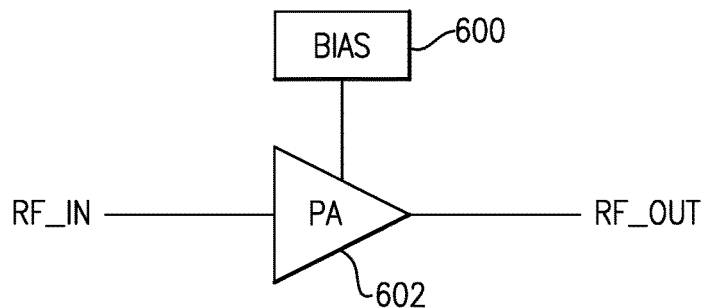
FIG. 17 depicts a power amplifier (PA) system having a PA coupled to a bias circuit.

Examples Related to Bias Circuit:

Described herein are non-limiting examples of how a power amplifier (PA) can be biased to yield desirable features such as improved linearity. FIG. 17 schematically depicts a PA system having a PA 602 coupled to a bias circuit 600. Examples related to the bias circuit 600 are described herein in greater detail. The PA 602 is shown to receive a radio-frequency (RF) signal (RF_IN) and generate an amplified RF signal (RF_OUT).

Figure 18:
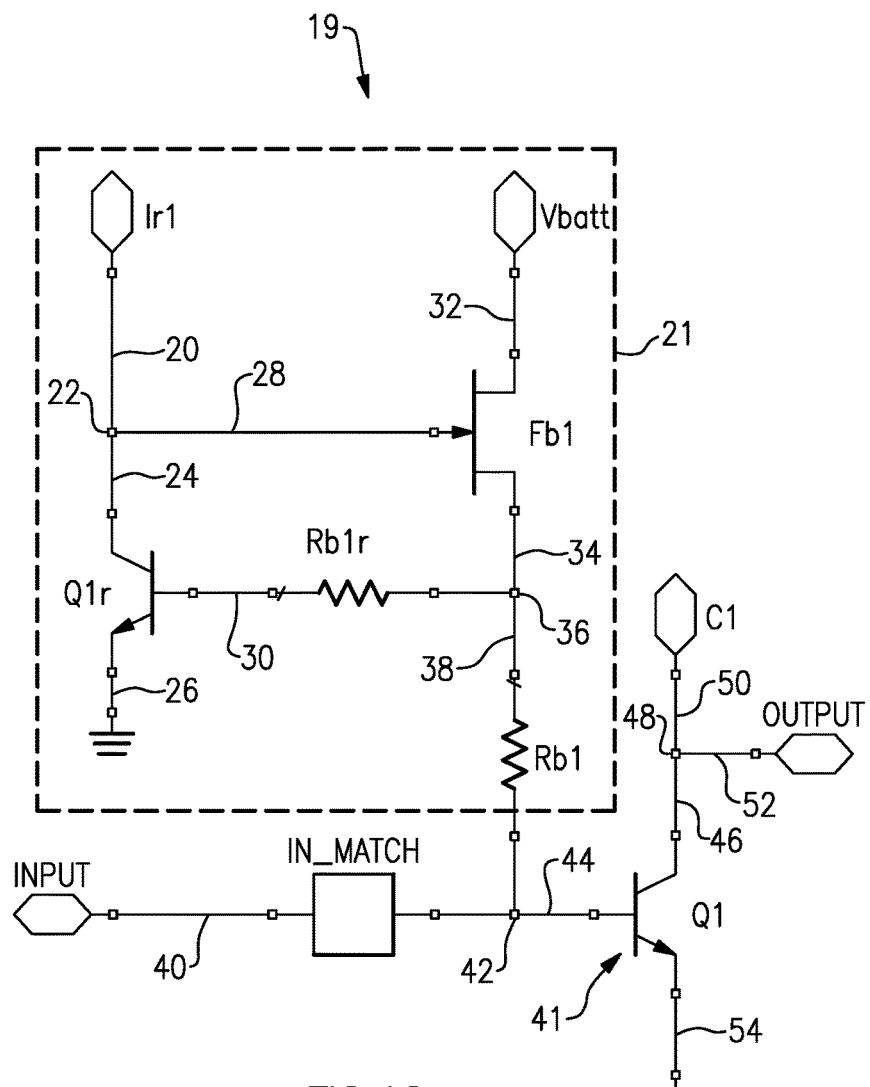
FIG. 18 shows an example of a typical biasing configuration that includes a bias circuit coupled to a PA stage.

FIG. 18 shows an example of a typical biasing configuration 19 that includes a bias circuit 21 coupled to a PA stage 41. For the purpose of description, such a PA stage can be, for example, a driver stage. The PA stage 41 can include an amplifying transistor Q1 such as a heterojunction bipolar transistor (HBT). It will be understood that one or more features of the present disclosure can also be implemented for other types of amplifying transistors. It will also be understood that one or more features of the present disclosure can also be implemented for PA stage(s) other than a driver stage.

The base of the transistor Q1 is shown to receive an input RF signal through an input port (Input), path 40, an input matching network (In_match), node 42, and path 44. The amplified RF signal is shown to be provided to an output port (Output) through the collector of the transistor Q1, path 46, node 48, and path 52. Supply voltage for the transistor Q1 can be provided to the collector of Q1 from a supply node (C1), through path 50, node 48, and path 46. The emitter of the transistor Q1 is shown to be coupled to ground through path 54.

Bias signal for the amplifying transistor Q1 is shown to be provided by the bias circuit 21 to the base node 42. Such a bias signal can be a bias current resulting from a current mirror arrangement between a reference side and a battery supply side. The reference side is shown to include a path between a reference current node (Ir1) and ground through path 20, node 22, path 24, a bipolar junction transistor (Q1$r$) (BJT such as an HBT), and path 26. The battery supply side is shown to include a path between a battery voltage node (Vbatt) and the node 42 through path 32, a field-effect transistor (Fb1), path 34, node 36, path 38, and a base resistance Rb1. The gate of the FET Fb1 is shown to be coupled to the collector node 22 of Q1$r$ through path 28. The base of the HBT Q1$r$ is shown to be coupled to the source node 36 of Fb1 through path 30 that includes a resistance Rb1$r$.

In the example of FIG. 18, an average or DC voltage at the source of Fb1 varies little with RF input power. Accordingly, the bias circuit 21 is generally unable to vary the bias current supplied to the amplifying transistor Q1 when power of the RF signal changes.

Figure 19:
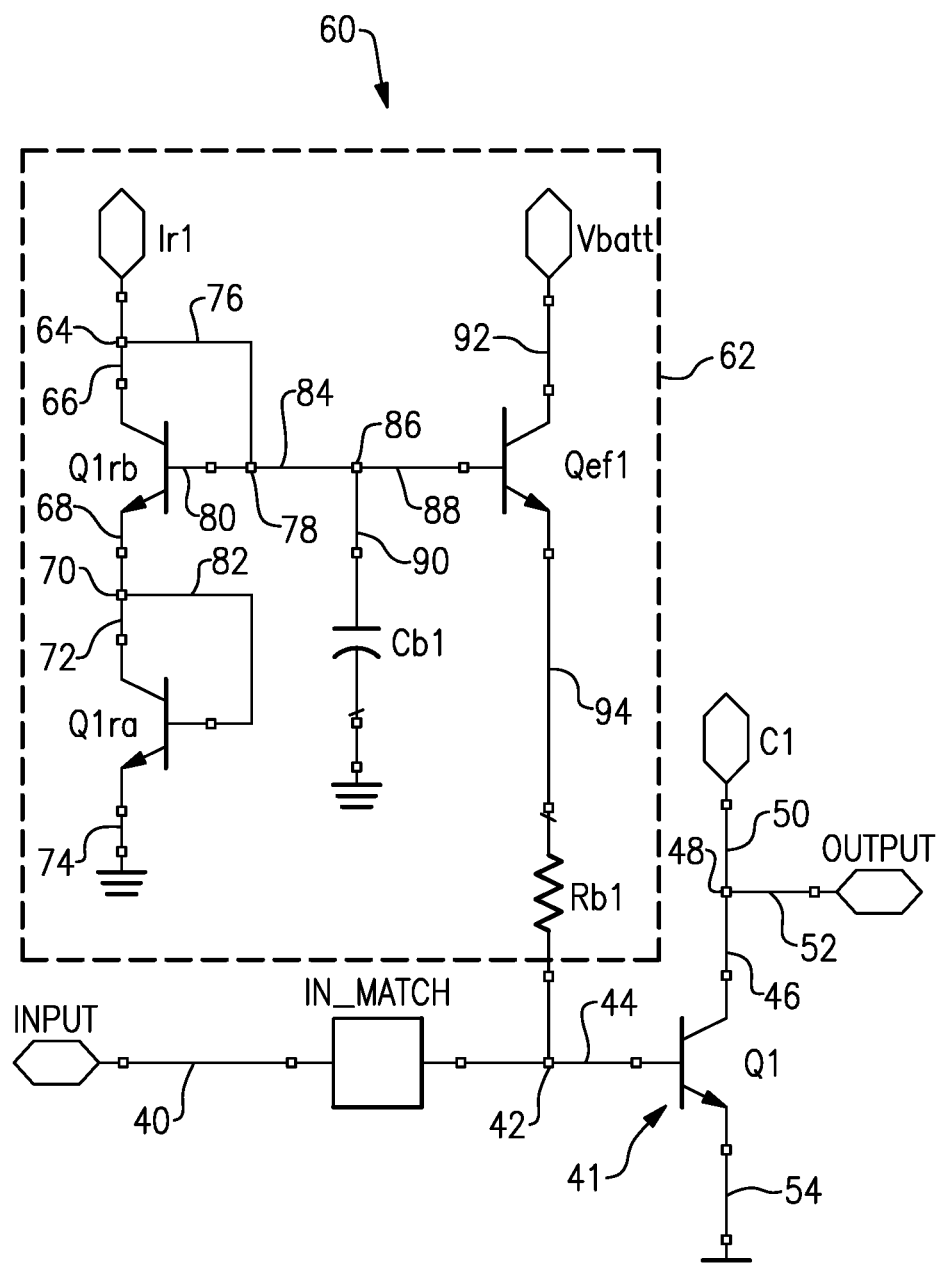
FIG. 19 shows an example of a biasing configuration where a bias circuit can provide varying biasing signal to an amplifying transistor, depending on the power associated with a radio-frequency (RF) signal.

FIG. 19 shows an example of a biasing configuration 60 where a bias circuit 62 can provide varying biasing signal to an amplifying transistor Q1, depending on the power associated with an RF signal. Such an RF signal is shown to be received by the base of Q1 through an input port (Input), path 40, an input matching network (In_match), node 42, and path 44. The amplified RF signal is shown to be provided to an output port (Output) through the collector of the transistor Q1, path 46, node 48, and path 52. Supply voltage for the transistor Q1 can be provided to the collector node 48 of Q1 from a supply node (C1), through path 50. The emitter of the transistor Q1 is shown to be coupled to ground through path 54.

Bias signal for the amplifying transistor Q1 is shown to be provided by the bias circuit 62 to the base node 42. Such a bias signal can be a bias current resulting from a current mirror arrangement between a reference side and a battery supply side. The reference side is shown to include a path between a reference current node (Ir1) and ground through node 64, path 66, a first BJT (Q1$rb$) (e.g., an HBT), path 68, node 70, path 72, a second BJT (Q1$ra$) (e.g., an HBT), and path 74. The battery supply side is shown to include a path between a battery voltage node (Vbatt) and the base node 42 through path 92, a third BJT (Qef1) (e.g., an HBT), path 94, and a base resistance Rb1.

In the example of FIG. 19, the collector and base of the first HBT Q1$rb$ are shown to be coupled through path 76 such that Q1$rb$ functions as a first diode D1. Similarly, the collector and base of the second HBT Q1$ra$ are shown to be coupled through path 82 such that Q1$ra$ functions as a second diode D2.

In the example of FIG. 19, the base of Q1$rb$ and the base of Qef1 are shown to be coupled by a path that includes path 80, node 78, path 84, node 86, and path 88. The node 86 between the bases of Q1$rb$ and Qef1 is shown to be coupled to ground through path 90 and a capacitance Cb1.

The foregoing example described in reference to FIG. 19 is a typical emitter follower bias linearizing circuit. In such a linearizing circuit, average or DC voltage at the emitter of Qef1 can vary with variation in RF input power, thereby resulting in some linearity enhancement. However, it is noted that typical emitter follower linearizing circuits, such as the example of FIG. 19, generally provide beneficial result at or near maximum average power associated with RF signals. Such typical emitter follower designs can also be sensitive to parasitic RF coupling effects.

Figure 20:
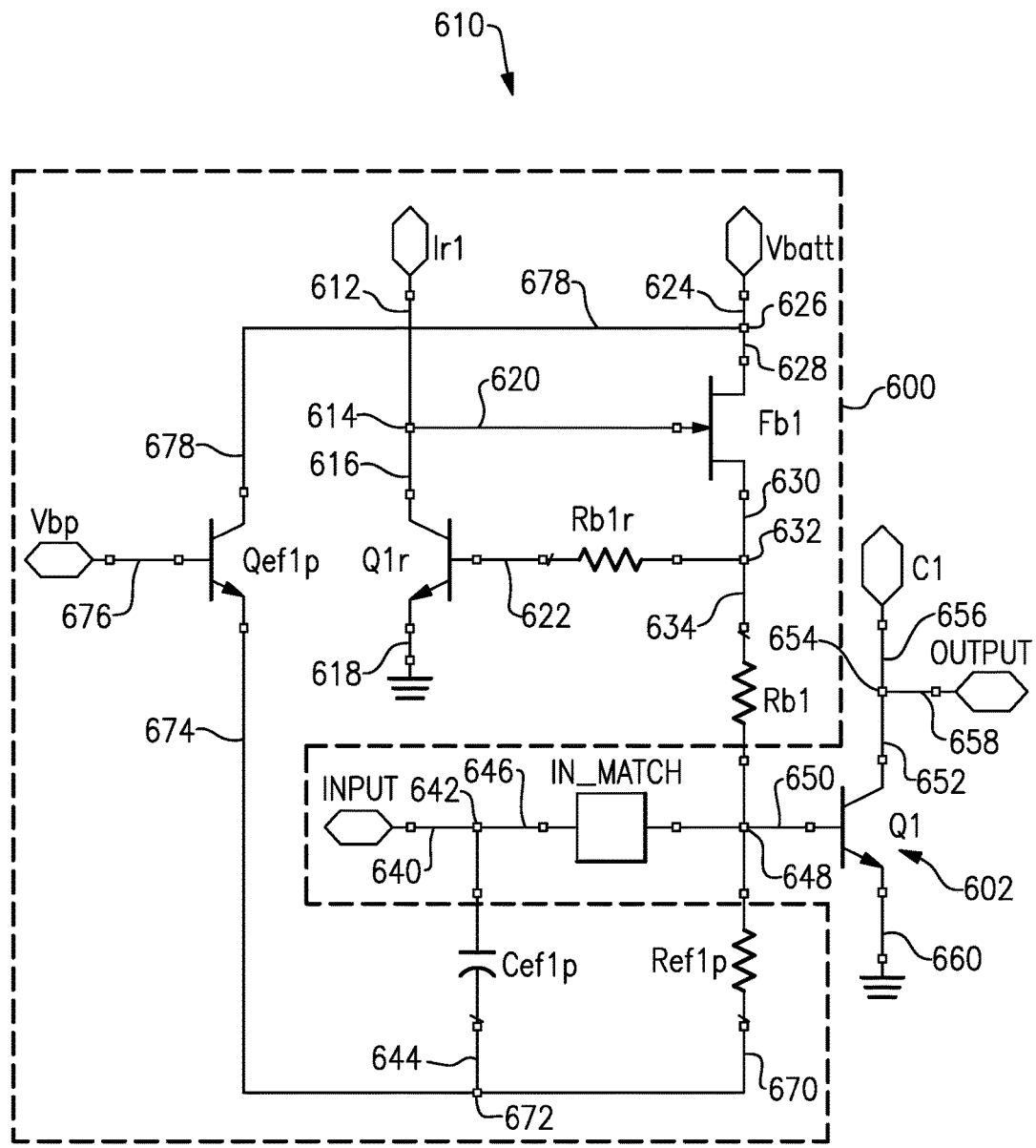
FIG. 20 shows an example of a biasing configuration where a bias circuit can provide varying biasing signal to an amplifying transistor so as to yield desirable effects such as improved linearity.

FIG. 20 shows an example of a biasing configuration 610 where a bias circuit 600 can provide varying biasing signal to an amplifying transistor Q1, so as to yield desirable effects such as improved linearity. In the example of FIG. 20, an RF signal is shown to be received by the base of an amplifying transistor 602 (Q1) (e.g., a BJT such as an HBT) through an input port (Input), path 640, node 642, path 646, an input matching network (In_match), node 648, and path 650. The amplified RF signal is shown to be provided to an output port (Output) through the collector of the transistor Q1, path 652, node 654, and path 658. Supply voltage for the transistor Q1 can be provided to the collector node 654 of Q1 from a supply node (C1), through path 656. The emitter of the transistor Q1 is shown to be coupled to ground through path 660.

In the example of FIG. 20, the bias circuit 600 can include a current mirror arrangement similar to the bias circuit 21 of FIG. 18. More particularly, a current mirror having a reference side and a battery supply side can be coupled to the base node 648 of the amplifying transistor Q1. The reference side is shown to include a path between a reference current node (Ir1) and ground through path 612, node 614, path 616, a BJT (Q1$r$) (e.g., an HBT), and path 618. The battery supply side is shown to include a path between a battery voltage node (Vbatt) and the base node 648 through path 624, node 626, path 628, a field-effect transistor (Fb1), path 630, node 632, path 634, and a base resistance Rb1. The gate of the FET Fb1 is shown to be coupled to the node 614 (and thus the collector of Q1$r$) through path 620. The base of the HBT Q1$r$ is shown to be coupled to the node 632 (and thus the source of Fb1) through path 622 that includes a resistance Rb1$r$.

In the example of FIG. 20, the bias circuit 600 can further include an emitter follower that couples the battery voltage node (Vbatt) and the base node 648 of the amplifying transistor Q1. Such a coupling path can include a BJT Qef1$p$ (e.g., an HBT), with its collector being coupled to the battery voltage node (Vbatt) through path 624, node 626, and path 678. The base of the BJT Qef1p is shown to be coupled to a DC voltage node (Vbp) through path 676. The emitter of the BJT Qef1p is shown to be coupled to the base node 648 of the amplifying transistor Q1 through path 674, node 672, path 670, and a resistance Ref1p. The emitter of the BJT Qef1p is also shown to be coupled to the input node 642 through path 644 that includes a capacitance Cef1p.

The example bias circuit 600 described in reference to FIG. 20 has been shown in simulation and in measurements to lower ACLR (adjacent-channel leakage ratio) and increase linear range of the output power (Pout), thereby increasing maximum linear power added efficiency (PAE). As described in reference to FIG. 20, the bias circuit 600 includes a parallel driver stage bias emitter follower (Qef1p). Although described in the context of a driver stage, it will be understood that one or more features of the present disclosure can also be implemented in connection with other PA stages.

In an example application involving an HBT RF power amplifier with a plurality of stages, it is noted that a relatively low impedance/low base bias (e.g., class AB) can be used in a final stage, while a relatively high base bias resistance can be used in a driver stage. The low final stage base bias can reduce the overall PA current, but can result in final stage gain expansion vs. RF power. The higher driver stage base bias and resistance can cause gain droop in the driver stage, compensating the final stage expansion. Overall flat phase and gain can be achieved, for example, up to compression of the final stage, with appropriate choice of driver and final stage base bias and impedance. Flat gain and phase vs. RF power (e.g., over the modulation bandwidth) can contribute to low ACLR. The final stage gain compression, however typically can be somewhat soft. For example, a 0.25 dB increase in 0.5 dB gain compression can increase linear Pout by about 0.25 dB and increase maximum linear PAE by about 1%. Both low ACLR and high PAE are increasingly valued.

As described in reference to FIG. 20, the RF signal at the input node (642) is capacitively coupled to the emitter of Qef1p (through Cef1p, path 644, node 672, and path 674). The emitter of Qef1p is also DC connected by a resistor (Ref1p) to the base node 648 of the driver stage Q1 (through path 674, node 672, path 670, and Ref1p) so as to be generally parallel with the reference path between Ir1 and ground. In some embodiments, the DC voltage (Vbp) applied to the base of Qef1p can be selected such that Qef1p is biased just below turn-on with low RF power (e.g., at the RF signal at the input node 642).

In the example of FIG. 20, and in an example context of a driver stage, positive RF peaks can be clamped by the base/emitter junction of the driver stage, resulting in the average driver stage base voltage decreasing with increasing RF power. As described herein, the driver stage gain and phase droop can compensate for the final stage expansion.

Negative RF peaks can be clamped by the emitter of Qef1p. In some embodiments, the average Qef1p emitter voltage can rise with increasing RF power. At some RF input power Qef1p can start to conduct, thereby increasing the driver stage base bias current through Ref1p. Accordingly, the stage's RF gain and phase droop can reverse and begin to expand. Vbp can be adjusted so the driver stage gain reversal substantially coincides with the final stage compression. For example, the foregoing overall PA 0.5 dB gain compression can be pushed out. The overall phase compression of the PA can also be pushed out.

Although the foregoing examples related to FIG. 20 are described in the context of a driver stage, it will be understood that one or more features as described herein can also be implemented in one or more other stages of a power amplifier.

As described herein in reference to FIG. 20, the path that includes Qef1p and Ref1p can be configured to be generally parallel with a conventional bias circuit. For example, such a conventional bias circuit can be a typical emitter follower bias circuit or a typical BiFET follower circuit. The latter can be configured to allow for low Vbatt compatibility. In the example of FIG. 20, the bias circuit 600 can be configured to obtain one or more desirable improvements in performance. For example, some or all of the normal bias current (Ib1), normal bias resistance (Rb1), Ref1p, Vbp, and RF coupling (e.g., Cef1p) can be independently set to optimize or improve performance of gain and phase vs. RF power. In some embodiments, Ib1 and Vbp can be controlled independently (e.g., through MIPI), and the foregoing improvement in performance can be extended to lower average power. In some embodiments, separate temperature compensation can also be applied to Vbp.

Figure 21:
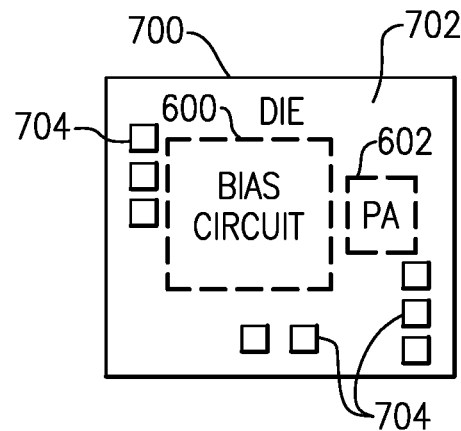
FIG. 21 depicts a die that can include a bias circuit having one or more features as described herein.

FIG. 21 schematically depicts a die 700 that can include a bias circuit 600 having one or more features as described herein. The semiconductor die 700 can include a substrate 702. In some embodiments, a power amplifier (PA) circuit 602 (e.g., HBT) can also be implemented on the substrate 702. For example, and in the context of an HBT PA, at least HBTs (e.g., Q1r and Qef1p of FIG. 20) of the bias circuit 600 can be formed on the same substrate 702. A plurality of connection pads 704 can also be formed on the substrate 702 to provide, for example, power and signals for the PA circuit 602 and the bias circuit 600.

Figure 22:
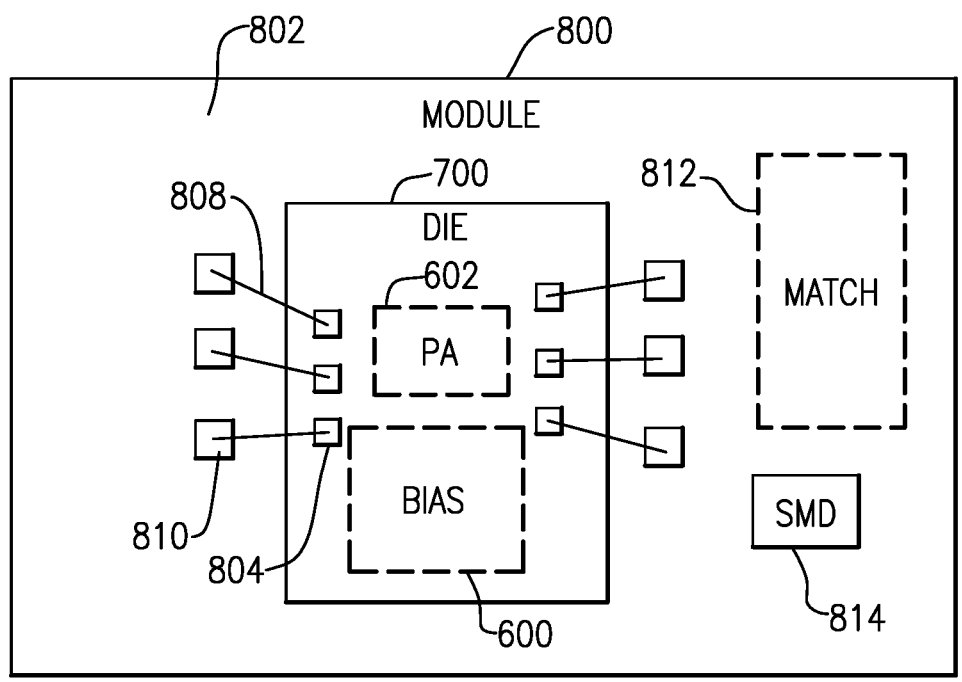
FIG. 22 depicts a module having one or more features as described herein.

In some implementations, one or more features described herein can be included in a module. FIG. 22 schematically depicts an example module 800 having a packaging substrate 802 that is configured to receive a plurality of components. In some embodiments, such components can include a die 700 having one or more featured as described herein. For example, the die 700 can include a PA circuit 602 and a bias circuit 600. A plurality of connection pads 804 can facilitate electrical connections such as wirebonds 808 to connection pads 810 on the substrate 802 to facilitate passing of various power and signals to and from the die 200.

In some embodiments, other components can be mounted on or formed on the packaging substrate 802. For example, one or more surface mount devices (SMDs) (814) and one or more matching networks (822) can be implemented. In some embodiments, the packaging substrate 802 can include a laminate substrate.

In some embodiments, the module 800 can also include one or more packaging structures to, for example, provide protection and facilitate easier handling of the module 800. Such a packaging structure can include an overmold formed over the packaging substrate 802 and dimensioned to substantially encapsulate the various circuits and components thereon.

It will be understood that although the module 800 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 23:
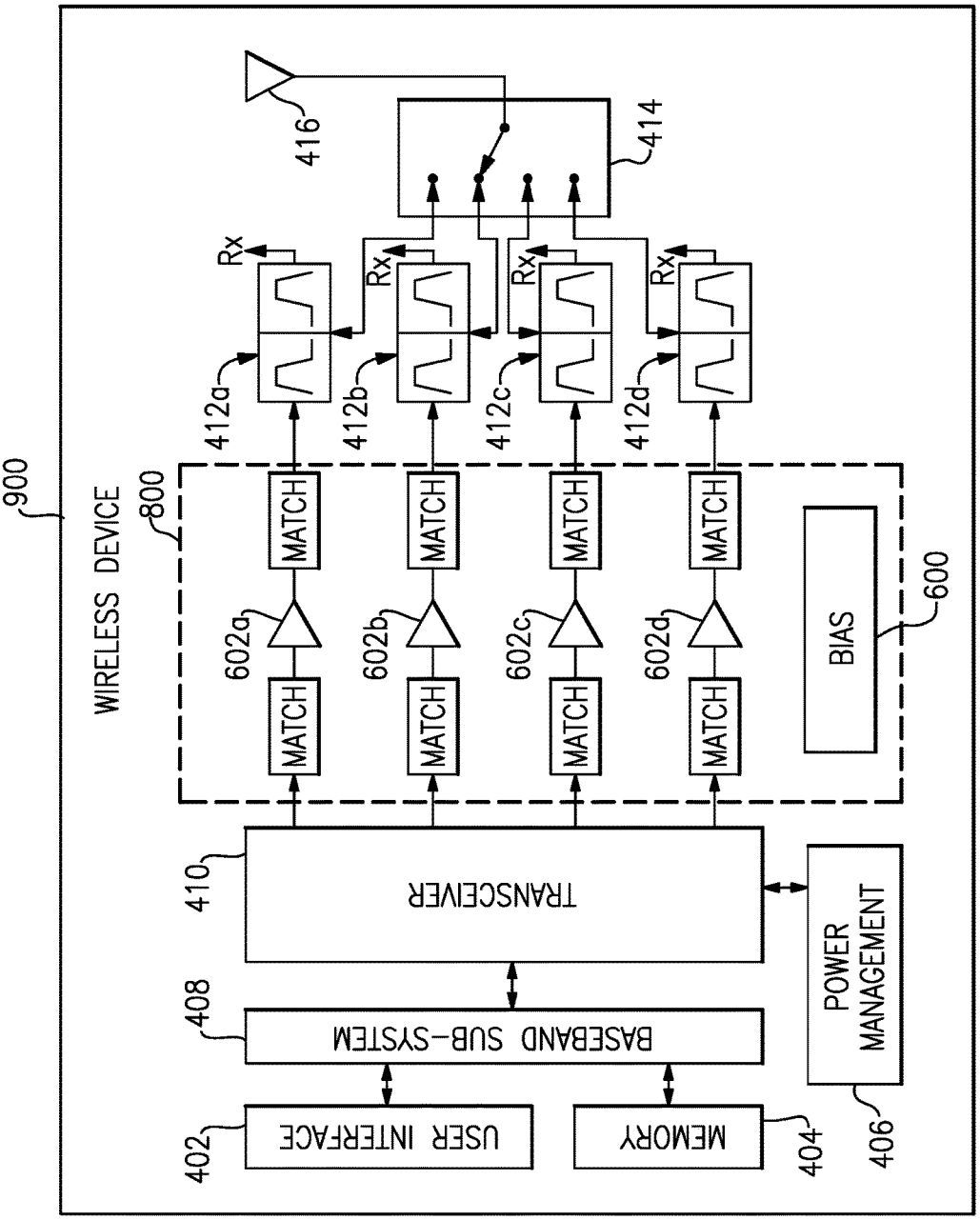
FIG. 23 depicts a wireless device having one or more features described herein.

FIG. 23 schematically depicts an example wireless device 900 having one or more advantageous features described herein. One or more PAs 602 as described herein are shown to be biased by one or more bias circuits 600 having one or more features as described herein. In embodiments where the PAs 602 and their bias circuit(s) 600 are packaged into a module, such a module can be represented by a dashed box 800. In some embodiments, the module 800 can include at least some of input and output matching circuits.

The PAs 602 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 900. Such power management can also control operations of the baseband sub-system 408 and the module 800.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 900, outputs of the PAs 602 are shown to be matched and routed to an antenna 416 via their respective duplexers 412a-412d and a band-selection switch 414. The band-selection switch 414 can be configured to allow selection of, for example, an operating band or an operating mode. In some embodiments, each duplexer 412 can allow transmit and receive operations to be performed simultaneously using a common antenna (e.g., 416). In FIG. 23, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
an amplification path including a first stage and a second stage, each stage having an input and an output, the output of the first stage coupled to the input of the second stage;
a first bias path implemented between a supply node and the input of the first stage;
a second bias path implemented between the supply node and the input of the first stage and configured to provide an additional bias signal to the input of the first stage under a selected condition;
a third bias path including a common node and a resistance, and configured to provide a bias signal to the input of the second stage; and
a coupling path implemented between the common node and the input of the second stage, and configured to improve linearity of the second stage operating in a first mode while allowing the resistance to be sufficiently robust for the second stage operating in a second mode.

2. The power amplifier of claim 1 wherein the first stage includes a driver stage, and the second stage includes an output stage.

3. The power amplifier of claim 1 wherein each of the first stage and the second stage includes an amplifying transistor having a base, a collector, and an emitter.

4. The power amplifier of claim 3 wherein the base of each amplifying transistor is the input of the respective stage, and the collector of each amplifying transistor is the output of the respective stage.

5. The power amplifier of claim 4 wherein the additional bias signal provided to the base of the first amplifying transistor includes an additional current.

6. The power amplifier of claim 4 wherein the first bias path and the second bias path are implemented to be electrically parallel between the supply node and the base of the first amplifying transistor.

7. The power amplifier of claim 4 wherein the resistance of the third bias path includes a ballast resistance.

8. The power amplifier of claim 4 wherein the second bias path includes an emitter follower having a collector, an emitter, and a base, the collector coupled to the supply node, the emitter coupled to the base of the first amplifying transistor.

9. The power amplifier of claim 8 wherein the emitter follower is configured to conduct at the selected condition to thereby provide the additional bias signal to the base of the first amplifying transistor, the selected condition including an increase in radio-frequency power at an input node of the power amplifier.

10. The power amplifier of claim 4 wherein the coupling path includes a capacitance.

11. The power amplifier of claim 10 wherein the coupling path further includes a resistance or an inductance connected in series with the capacitance.

12. The power amplifier of claim 1 wherein the first mode includes an EDGE (enhanced data rates for GSM evolution) mode, and the second mode includes a GPRS (general packet radio service) mode.

13. A power amplifier module comprising:
a packaging substrate configured to receive a plurality of components;
a power amplifier implemented on the packaging substrate, and including an amplification path having a first stage and a second stage, each stage having an input and an output, the output of the first stage coupled to the input of the second stage, the power amplifier further including a first bias path implemented between a supply node and the input of the first stage, and a second bias path implemented between the supply node and the input of the first stage and configured to provide an additional bias signal to the input of the first stage under a selected condition, the power amplifier further including a third bias path having a common node and a resistance, and configured to provide a bias signal to the input of the second stage, and a coupling path implemented between the common node and the input of the second stage, and configured to improve linearity of the second stage operating in a first mode while allowing the resistance to be sufficiently robust for the second stage operating in a second mode.

14. The power amplifier module of claim 13 wherein each of the first stage and the second stage includes an amplifying transistor having a base, a collector, and an emitter.

15. The power amplifier module of claim 14 wherein at least the first and second amplifying transistors are implemented on a semiconductor die.

16. The power amplifier module of claim 15 wherein the semiconductor die includes gallium arsenide.

17. A wireless device comprising:
a transceiver configured to generate a signal;
a power amplifier circuit configured to amplify the signal, and including an amplification path having a first stage and a second stage, each stage having an input and an output, the output of the first stage coupled to the input of the second stage; a first bias path implemented between a supply node and the input of the first stage; a second bias path implemented between the supply node and the input of the first stage and configured to provide an additional bias signal to the input of the first stage under a selected condition; a third bias path having a common node and a resistance, and configured to provide a bias signal to the input of the second stage; and a coupling path implemented between the common node and the input of the second stage, and configured to improve linearity of the second stage operating in a first mode while allowing the resistance to be sufficiently robust for the second stage operating in a second mode; and
an antenna in communication with the power amplifier circuit and configured to facilitate transmission of the amplified signal.

18. The wireless device of claim 17 wherein the wireless device is a portable device.

19. The wireless device of claim 18 wherein the portable device is configured to provide cellular communication.

20. The wireless device of claim 19 wherein the portable device is configured to be capable of operating in the first mode that includes an EDGE (enhanced data rates for GSM evolution) mode, or in the second mode that includes a GPRS (general packet radio service) mode.

* * * * *